US011101277B2

(12) United States Patent
Yeh

(10) Patent No.: US 11,101,277 B2
(45) Date of Patent: Aug. 24, 2021

(54) PROCESS FOR MANUFACTURING NOR MEMORY CELL WITH VERTICAL FLOATING GATE

(71) Applicant: Greenliant IP, LLC, Santa Clara, CA (US)

(72) Inventor: Bing Yeh, Los Altos Hills, CA (US)

(73) Assignee: GREENLIANT IP, LLC., Santa Clara, CA (US)

( * ) Notice: Subject to any disclaimer, the term of this patent is extended or adjusted under 35 U.S.C. 154(b) by 0 days.

(21) Appl. No.: 16/824,384

(22) Filed: Mar. 19, 2020

(65) Prior Publication Data

US 2020/0303387 A1 Sep. 24, 2020

Related U.S. Application Data

(60) Provisional application No. 62/821,329, filed on Mar. 20, 2019.

(51) Int. Cl.
*H01L 27/11531* (2017.01)
*H01L 27/11521* (2017.01)
(Continued)

(52) U.S. Cl.
CPC .. *H01L 27/11531* (2013.01); *H01L 21/26513* (2013.01); *H01L 27/11521* (2013.01);
(Continued)

(58) Field of Classification Search
CPC ......... H01L 27/11531; H01L 21/26513; H01L 27/11521
See application file for complete search history.

(56) References Cited

U.S. PATENT DOCUMENTS 7,192,832 B2 * 3/2007 Chang ................... H01L 27/115
257/E21.692
9,583,640 B1 * 2/2017 Richter ............. H01L 27/11539
(Continued)

FOREIGN PATENT DOCUMENTS

CN 101419972 A 4/2009
EP 1059673 A2 12/2000

OTHER PUBLICATIONS

Greenliant IP LLC, International Search Report/Written Opinion, PCT/US2018/049875, dated Nov. 27, 2018, 11 pgs.
(Continued)

*Primary Examiner* — Errol V Fernandes
(74) *Attorney, Agent, or Firm* — Morgan, Lewis & Bockius LLP

(57) ABSTRACT

An electrically erasable programmable nonvolatile memory cell includes a semiconductor substrate having a first substrate region and a trench region apart from the first substrate region in a lateral direction, a channel region between the first substrate region and the bottom portion of the trench region, an electrically conductive control gate insulated from and disposed over the first channel portion, an electrically conductive floating gate insulated from the bottom
(Continued)

and sidewall portions of the trench region, an insulation region disposed over the second channel portion between the control gate and the second floating gate portion, an electrically conductive source line insulated from the floating gate and electrically connected to the trench region of the substrate, and an electrically conductive erase gate insulated from and disposed over a tip of the floating gate.

23 Claims, 35 Drawing Sheets

(51) Int. Cl.
  *H01L 21/265* (2006.01)
  *H01L 29/788* (2006.01)
  *H01L 29/423* (2006.01)
  *H01L 29/66* (2006.01)
  *H01L 21/28* (2006.01)

(52) U.S. Cl.
  CPC .. *H01L 29/40114* (2019.08); *H01L 29/42328* (2013.01); *H01L 29/66825* (2013.01); *H01L 29/7883* (2013.01)

(56) References Cited

U.S. PATENT DOCUMENTS

| | | |
|---|---|---|
| 2004/0183121 A1* | 9/2004 | Yeh .................. H01L 27/11553 257/315 |
| 2005/0045940 A1 | 3/2005 | Chen |
| 2006/0043459 A1 | 3/2006 | Chen |
| 2006/0234444 A1 | 10/2006 | Wu |
| 2019/0165115 A1* | 5/2019 | Lin .................. H01L 29/66833 |

OTHER PUBLICATIONS

Greenliant IP LLC, International Search Report/Written Opinion, PCT/US2018/049877, dated Nov. 29, 2018, 9pgs.
Greenliant IP LLC, International Preliminary Report on Patentability, PCT/US2018/049875, dated Mar. 17, 2020, 9 pgs.
Greenliant IP LLC, International Preliminary Report on Patentability, PCT/US2018/049877, dated Mar. 7, 2020, 7 pgs.
Yeh, Non-Final Office Action, U.S. Appl. No. 16/122,800, dated Jul. 10, 2019, 7 pgs.
Yeh, Notice of Allowance, U.S. Appl. No. 16/122,800, dated Nov. 18, 2019, 7 pgs.
Yeh, Notice of Allowance, U.S. Appl. No. 16/825,808, dated Apr. 14, 2021, 2 pgs.
Yeh, Notice of Allowance, U.S. Appl. No. 16/825,808, dated Jun. 14, 2021, 2 pgs.

* cited by examiner

PROCESS FOR MANUFACTURING NOR MEMORY CELL WITH VERTICAL FLOATING GATE

RELATED APPLICATIONS

This application claims priority to U.S. Provisional Application No. 62/821,329, filed Mar. 20, 2019, entitled "Process for Manufacturing NOR Memory Cell with Vertical Floating Gate," which is hereby incorporated by reference in its entirety.

This application is related to U.S. patent application Ser. No. 16/122,800, filed Sep. 5, 2018, entitled "NOR Memory Cell with Vertical Floating Gate," which claims priority to U.S. Provisional Application No. 62/559,418, filed Sep. 15, 2017, entitled "NOR Memory Cell with Vertical Floating Gate," each of which is hereby incorporated by reference in its entirety.

This application is related to U.S. patent application Ser. No. 16/122,795, filed Sep. 5, 2018, entitled "NOR Memory Cell with L-Shaped Floating Gate," which claims priority to U.S. Provisional Application No. 62/559,414, filed Sep. 15, 2017, entitled "NOR Memory Cell with L-Shaped Floating Gate," each of which is hereby incorporated by reference in its entirety.

TECHNICAL FIELD

This relates generally to semiconductor memory device fabrication processes, including but not limited to processes for fabricating electrically programmable and erasable nonvolatile memory cells, sometimes called NOR memory cells, having a vertical floating gate.

BACKGROUND

While fabricating a nonvolatile semiconductor memory cell array, e.g., an array of stacked-gate memory cells in which each memory cell has a floating gate and a control gate, the fabrication process requires the use of many masks and corresponding processing steps, which adds complexity, making the process less efficient and more difficult to control.

In addition, when the memory cells are each designed to have a floating gate portion disposed in a trench in the substrate, difficulties arise when forming the trench. For instance, when etching through thick layers of oxide, it is difficult to detect the surface of the silicon substrate, leading to non-uniform trench depths across the wafer.

SUMMARY

Accordingly, there is a need to improve the efficiency of processes for manufacturing nonvolatile memory cells, such as NOR memory cells. Such methods improve the fabrication efficiency by combining certain deposition steps when forming peripheral logic transistor gates and memory cell gates. Such methods further improve the fabrication process by depositing less oxide in the vicinity of the trenches, thereby improving trench depth uniformity which in turn leads to more uniform memory cell operation across the wafer.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1A:
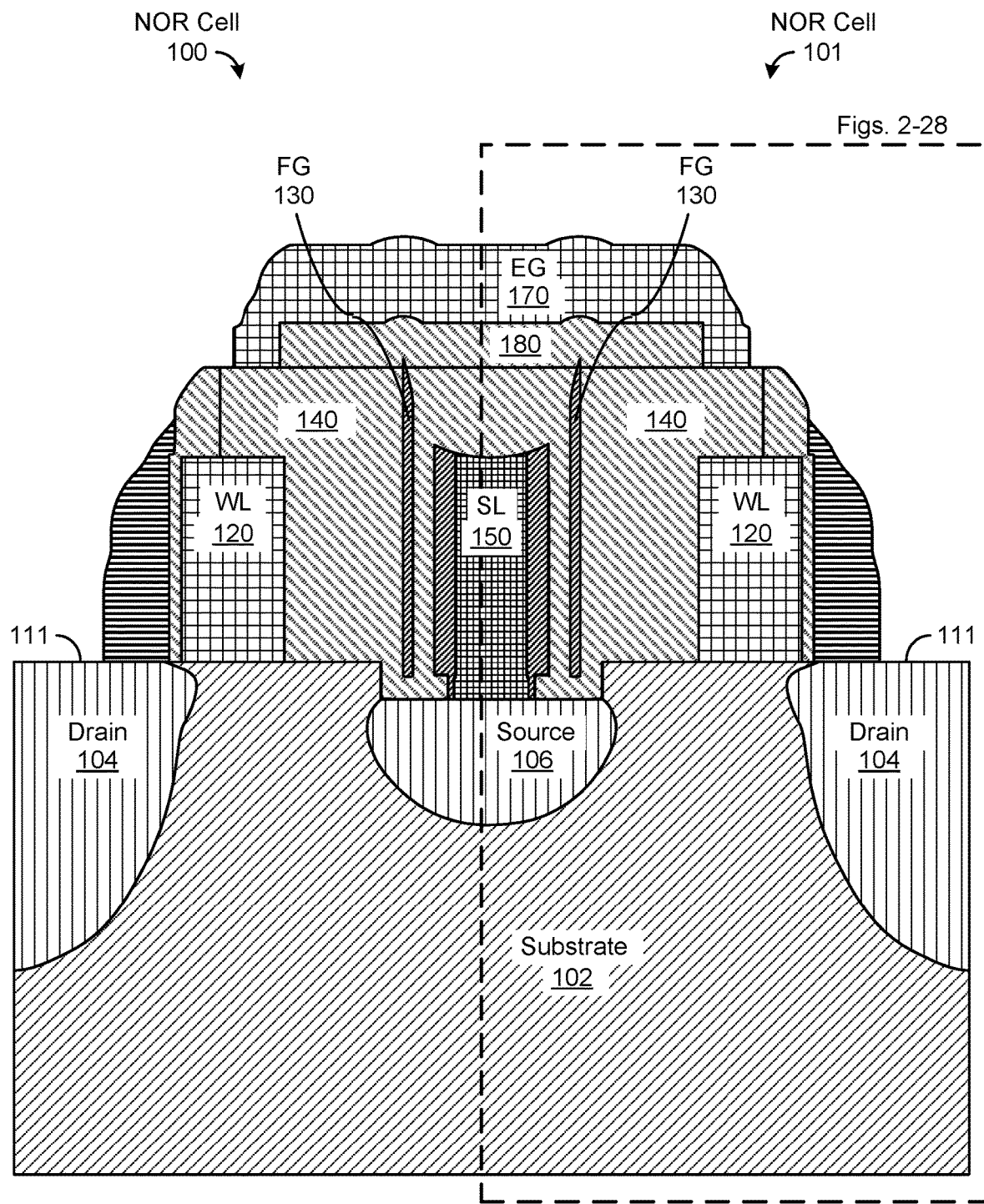
FIG. 1A is a diagram illustrating a cross section view of a pair of electrically erasable programmable nonvolatile memory cells in accordance with some embodiments.

Attention is now directed toward embodiments of an electrically erasable programmable nonvolatile memory cell, sometimes called a NOR memory cell or split-gate NOR memory cell, in accordance with some embodiments. FIG. 1A is a cross section of a pair of memory cells 100, 101. The memory cells mirror each other, with a memory cell formed on each side of, and including, a shared source line 150. In the interest of brevity, the remainder of this disclosure references only one memory cell, memory cell 101. However, it is appreciated that neighboring memory cell 100 has corresponding features and behaves similarly under similar circumstances. In some embodiments, memory cells 100 and 101 correspond to memory cells 100 and 101 as described with regard to FIGS. 1-4 of U.S. patent application Ser. No. 16/122,800, entitled "NOR Memory Cell with Vertical Floating Gate," which is incorporated by reference in its entirety.

In some embodiments, memory cell 101 includes a semiconductor substrate 102 having a first substrate region 104 (sometimes referred to as a drain region) and a trench region 106 (sometimes referred to as a source region or a source line region). In some embodiments, the first substrate region 104 serves as a drain, although it is appreciated that the source and drain of a transistor can be switched during operation. Substrate 102 further includes a horizontal surface 111, disposed over the drain region 104 and extending in a lateral direction towards trench region 106. In some embodiments, at least a portion of surface 111 is a silicon-oxide interface (e.g., between a silicon substrate and an oxide-based insulation region). For the purposes of this disclosure, the term "trench" describes a region from which substrate material has been removed, and thus an absence of substrate material, while the term "trench region" describes various regions of the substrate adjacent to the trench.

In some embodiments, memory cell 101 further includes an electrically conductive control gate 120 (sometimes referred to herein as a word line), an electrically conductive floating gate 130, and an insulation region 140 (sometimes referred to herein as a gate separation insulation region, or an oxide layer) disposed between control gate 120 and floating gate 130. In some embodiments, floating gate 130 includes a first portion disposed inside the trench, and a second portion disposed above the trench and extending away from the trench. In some embodiments, the second portion is longer than the first portion. In some embodiments, the second portion includes a pointed tip (e.g., located at the end of the floating gate closest to the erase gate 170). In some embodiments, the second portion includes a tip that is not pointed, but instead has a diameter substantially equal to a diameter of the first portion of the floating gate. Stated another way, while in some embodiments the tip of the floating gate 130 is tapered (as shown in FIG. 1A), the floating gate in other embodiments is so thin that the tip and the body of the floating gate are substantially the same diameter (not shown).

In some embodiments, memory cell 101 further includes an electrically conductive source line 150 electrically connected to a bottom portion of the trench region 106. Source line 150 extends away from the substrate. In some embodiments, source line 150 includes a first portion disposed at least partially inside the trench and electrically connected to the bottom of the trench region 106, and a second portion disposed above the first portion. In some embodiments, at least a portion of the source line is disposed outside the trench.

In some embodiments, memory cell 101 further includes a dielectric layer between at least a portion of the floating gate 130 and at least a portion of the source line 150. In some embodiments, the dielectric layer is a "thin" dielectric layer, so as to provide a strong capacitive coupling between floating gate 130 and source line 150. In some embodiments, the dielectric layer comprises a combination of oxide and nitride, or other high dielectric constant material. In some embodiments, the dielectric layer has a combined total thickness between 6 nm and 10 nm.

In some embodiments, memory cell 101 further includes an insulation layer between at least a portion of the floating gate 130 and at least a portion of the trench sidewall. In some embodiments, the insulation layer comprises a combination of oxide and nitride, or other high dielectric constant material. In some embodiments, compared with a conventional silicon oxide layer, the insulation layer provides a lower interface energy barrier (sometimes called an energy barrier height) for hot electrons to overcome in order to be injected into the floating gate 130. In some embodiments, the low interface energy barrier provided by the dielectric material of the insulation layer is less than 2.5 eV (electron volts), and in some embodiments is less than 2.0 eV, or less than 1.3 eV.

In some embodiments, memory cell 101 further includes an electrically conductive erase gate 170 insulated from and disposed over the top of the floating gate 130. Erase gate 170 is insulated from the floating gate portion 130 by an insulation layer 180, sometimes referred to herein as an erase gate insulation region, disposed between the erase gate and the tip of the second floating gate portion. In some embodiments, the insulation layer is a tunnel oxide, through which tunneling electrons travel between the tip of the floating gate and the erase gate. In some embodiments, erase gate 170 is further disposed over at least a portion of the source line 150.

In some embodiments, the capacitive coupling between floating gate 130 and erase gate 170 is much weaker than the capacitive coupling between floating gate 130 and source line 150, which is beneficial for efficiently and quickly erasing the memory cell. In some embodiments, the combined capacitive coupling between the floating gate 130, source line 150, and control gate 120 is greater than the capacitive coupling between the floating gate 130 and the erase gate 170 by a ratio of at least 5 to 1 (i.e., the capacitive coupling ratio is at least 5 to 1), and in some embodiments the aforementioned capacitive coupling ratio is at least 100 to 1, 50 to 1, or 10 to 1. The strong capacitive coupling between the floating gate 130 and the source line 150 (compared to the capacitive coupling between the floating gate and the erase gate) is caused by the proximity of the floating gate 130 to the source line 150, as well as the large surface area of the vertical face of the floating gate 130 that is in close proximity to the source line 150. In some embodiments, the space between the tip of the floating gate 130 and the erase gate is in the range of 100 Å-200 Å. In some embodiments, the space between the floating gate 130 and the source line 150 is 50 Å-100 Å (e.g., 80 Å).

In some embodiments, conductive elements of the memory cell 100 (e.g., control gate 120, floating gate 130, source line 150, and/or erase gate 170) are constructed of appropriately doped polysilicon. It is appreciated that "polysilicon" refers to any appropriate conductive material, formed at least in part from silicon or metal material, that can be used to form the conductive elements of nonvolatile memory cells. In addition, in accordance with some embodiments, insulation elements of the memory cell 101 (e.g., insulation regions 140 and 180) are constructed of silicon dioxide, silicon nitride, and/or any appropriate insulator that can be used to form the insulation elements of nonvolatile memory cells.

Figure 1B:
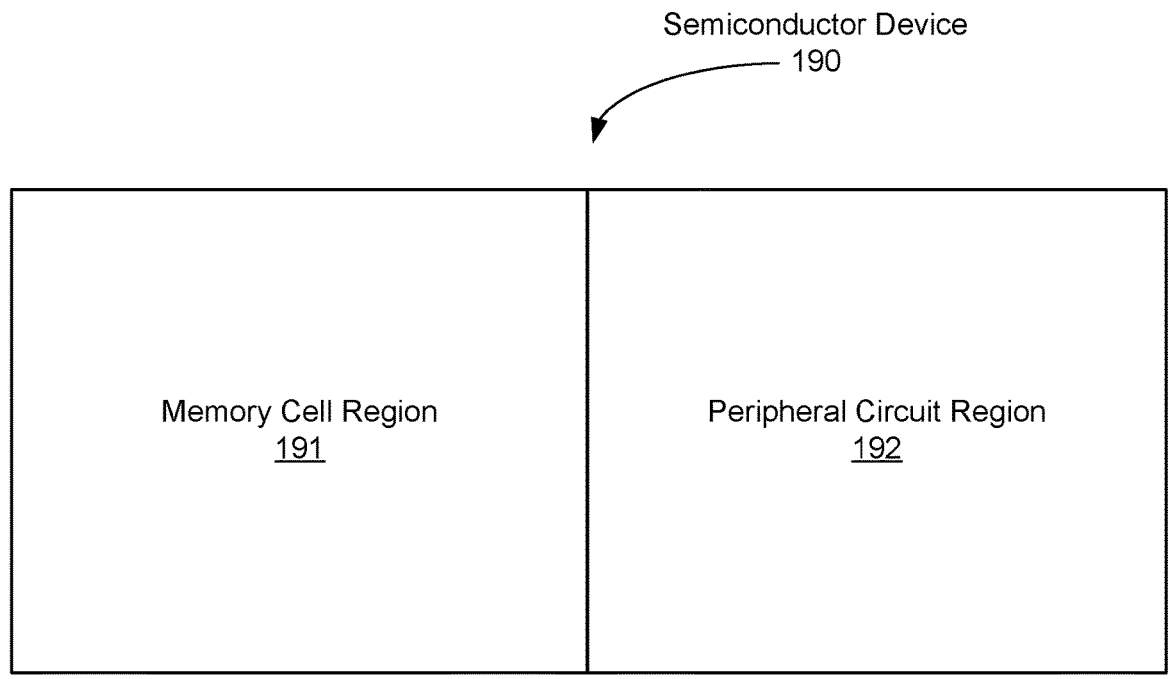
FIG. 1B is a plan view of a semiconductor device including both a memory cell region and a peripheral circuit region.

In some embodiments, as shown in FIG. 1B, memory cells 100 and 101 are memory cells in an array of memory cells, located in a memory cell region 191 of a semiconductor device 190, sometimes called a chip or die, that also includes a peripheral circuit region 192 in which logic circuitry, the logic circuitry including transistors, sometimes herein called peripheral transistors.

Figure 1C:
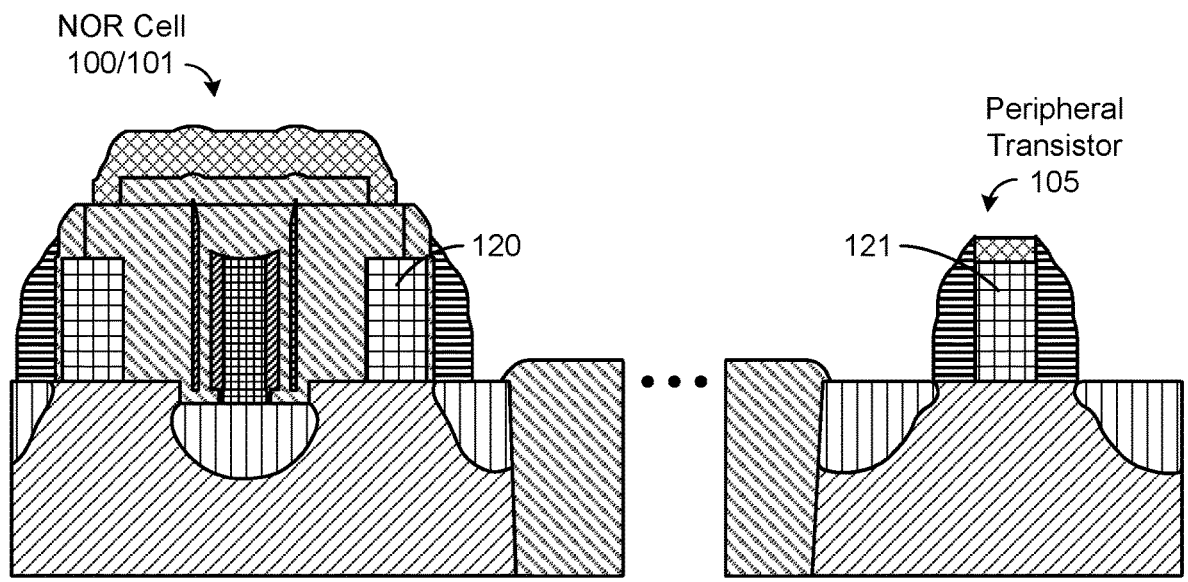
FIG. 1C is a diagram illustrating a cross section view of a pair of electrically erasable programmable nonvolatile memory cells and a peripheral transistor in accordance with some embodiments.

FIG. 1C illustrates an example cross section of memory cells 100 and 101 (e.g., located in memory cell region 191 in FIG. 1B), and a peripheral transistor 105 (e.g., located in peripheral circuit region 192 in FIG. 1B). As shown in the example, memory cell 101 includes a control gate 120, and peripheral transistor 105 includes a gate 121. In some embodiments, gates 120 and 121 are fabricated during the same manufacturing steps, as described in more detail with reference to FIGS. 29-33 below.

Figure 1D:
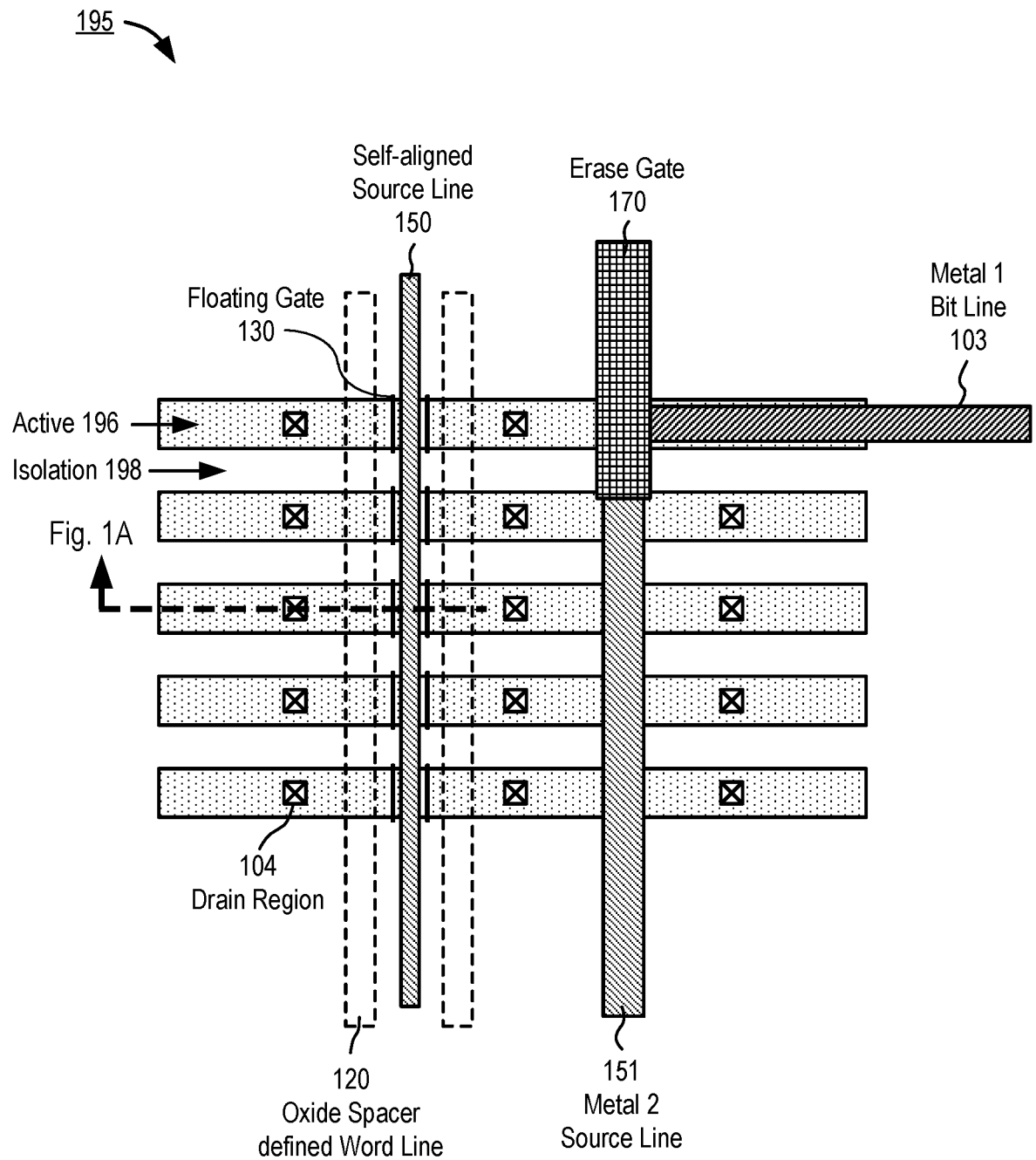
FIG. 1D is a diagram illustrating a plan view of a memory cell array in accordance with some embodiments.

FIG. 1D illustrates a plan view of a memory cell array 195 in accordance with some embodiments. In some embodiments, metal 1 bit lines 103 interconnect with drain regions 104. Oxide spacer defined word lines 120 extend across both the active regions 196 and the isolation regions 198. The self-aligned source lines 150 electrically connect to the source regions for each row of paired memory cells. The floating gates 130 are disposed in trenches in the active regions 196 underneath the erase gates 170. In some embodiments, metal 2 source line 151 is connected to source lines 150 (e.g., FIG. 1A).

Manufacturing Process

Attention is now directed to FIGS. 2-33, which illustrate a process for manufacturing a memory cell (e.g., memory cell 101) in accordance with some embodiments. A process in accordance with some embodiments begins in FIG. 2, which shows a cross-section view of silicon substrate 202 and an oxide layer 204 (e.g., a thin gate oxide), above which polysilicon material 206 is deposited. The final structure depicted in FIGS. 1 and 28 is substantially similar to the memory cell structure described in U.S. patent application Ser. No. 16/122,800. However, embodiments of the fabrication process described herein are simpler, and easier to control. In the U.S. patent application Ser. No. 16/122,800 process, when polysilicon is deposited for the control gates of memory cells of the integrated circuit, transistors forming peripheral logic of the integrated circuit have not yet been formed. But in embodiments described herein, the peripheral transistors are substantially complete, to the extent that the peripheral transistor gates are formed at the same time as the control gates of the memory cells. The peripheral transistors, which have different oxide thicknesses, are well defined.

Figure 2:
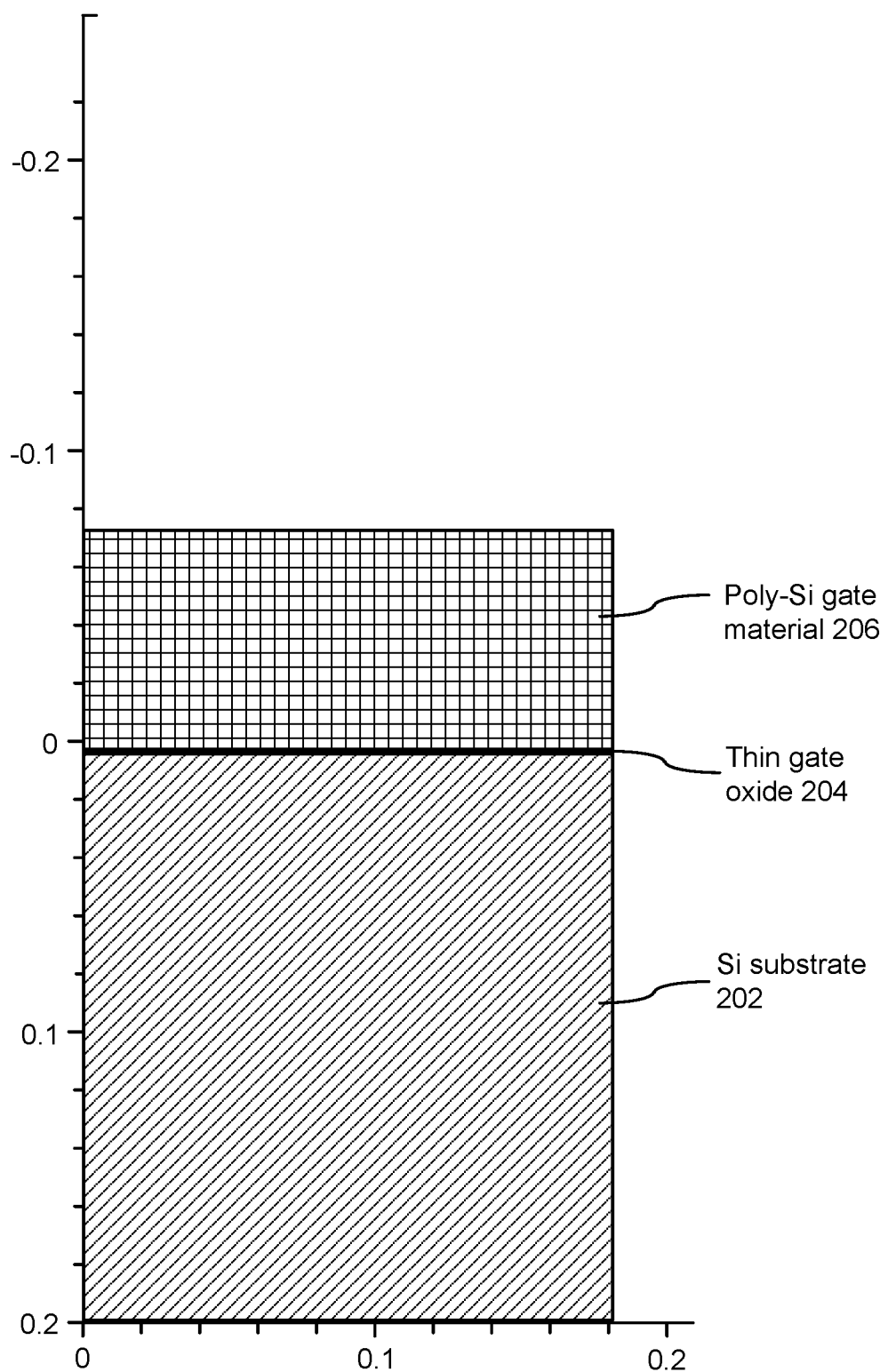
FIGS. 2-28 illustrate a process for manufacturing an array of electrically erasable programmable nonvolatile memory cells in accordance with some embodiments.

Referring to FIG. 2, polysilicon (hereinafter poly) 206 is deposited over a thin gate oxide layer 204 (e.g., having a thickness of 22 Å) on top of the substrate 202. The gate oxide 204 is also used for peripheral logic transistors (see, e.g., FIG. 29). The poly 206 serves as: (i) gate material (also called gate conductor material) for peripheral logic transistors (see FIG. 33 gate 121), and (ii) the word line of the memory cell (see FIG. 33 control gate 120). In particular, at this stage of the process, a transistor region of the peripheral circuit region looks substantially the same as the memory cell portion shown in FIG. 2 (see FIG. 29 regions 191 and 192), except that, in some embodiments, the peripheral transistor gate oxide has a different thickness than the thickness of thin gate oxide 204. Typically, the gate oxide 204 for the memory cell and peripheral circuitry is between 20 Å and 50 Å thick.

Figure 3:
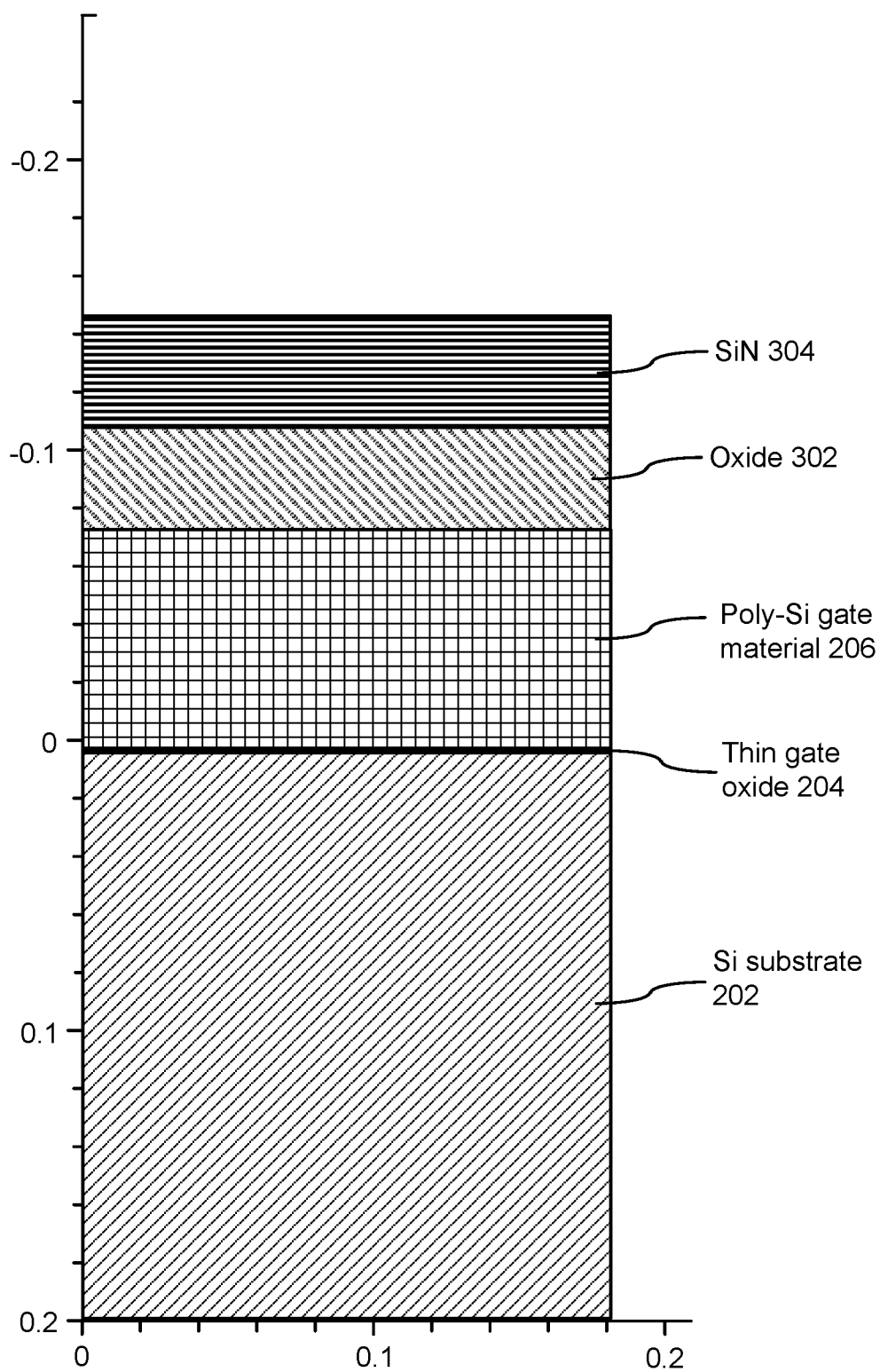

Referring to FIG. 3, an oxide layer 302, sometimes called a first stacking oxide layer, and a nitride layer 304 (e.g., SiN) are deposited on top of the poly 206. See FIG. 29 for an expanded view of this process step, including the memory cell region 191 and the peripheral circuit region 192.

Figure 4:
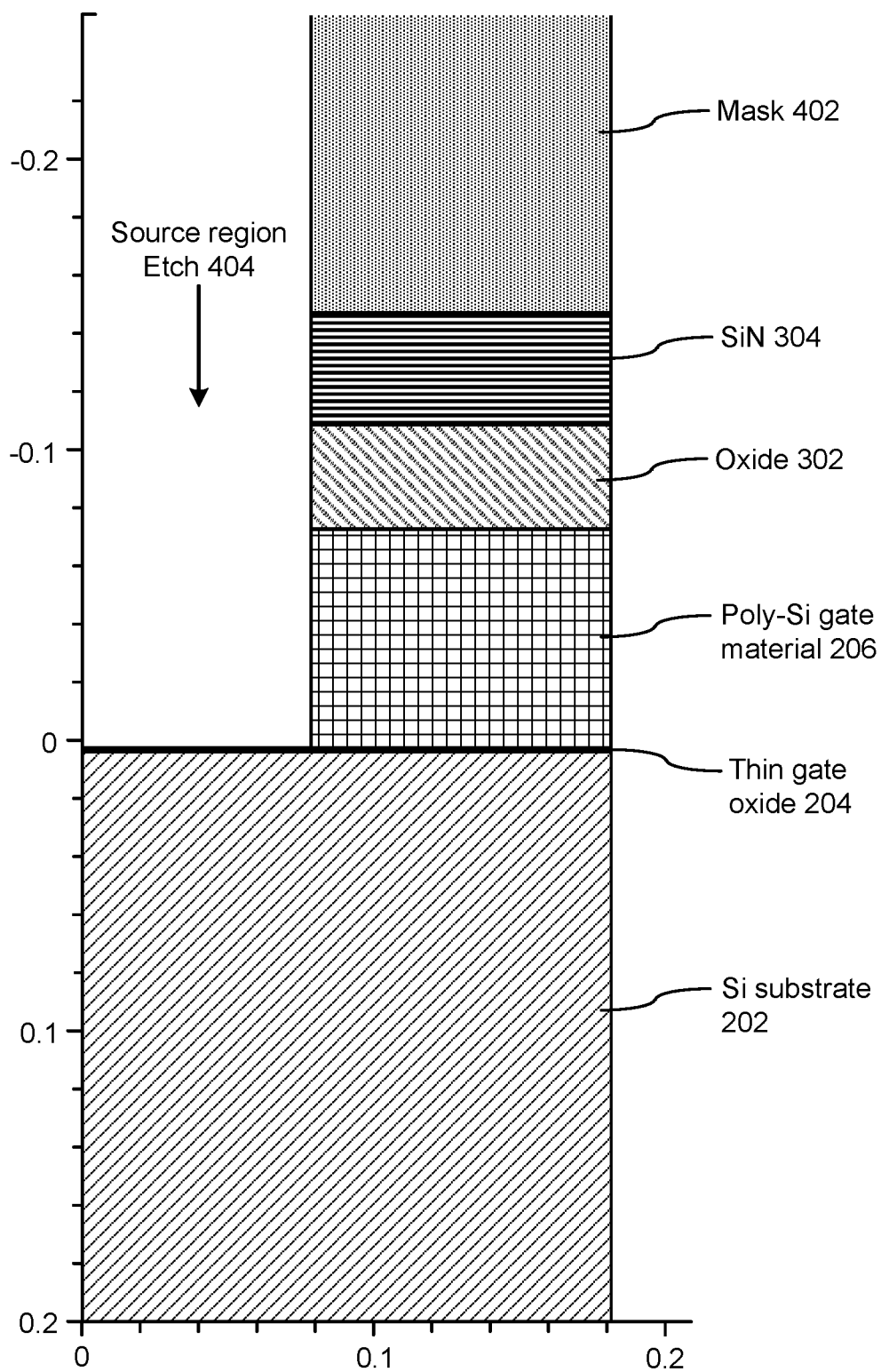

Referring to FIG. 4, the source line region is defined (e.g., using an etch operation 404). The source line region defines the decoupling oxide 502, the floating gate, and the source line for each memory cell. In some embodiments, the source line region is opened using a mask 402 and etching 404.

Figure 5:
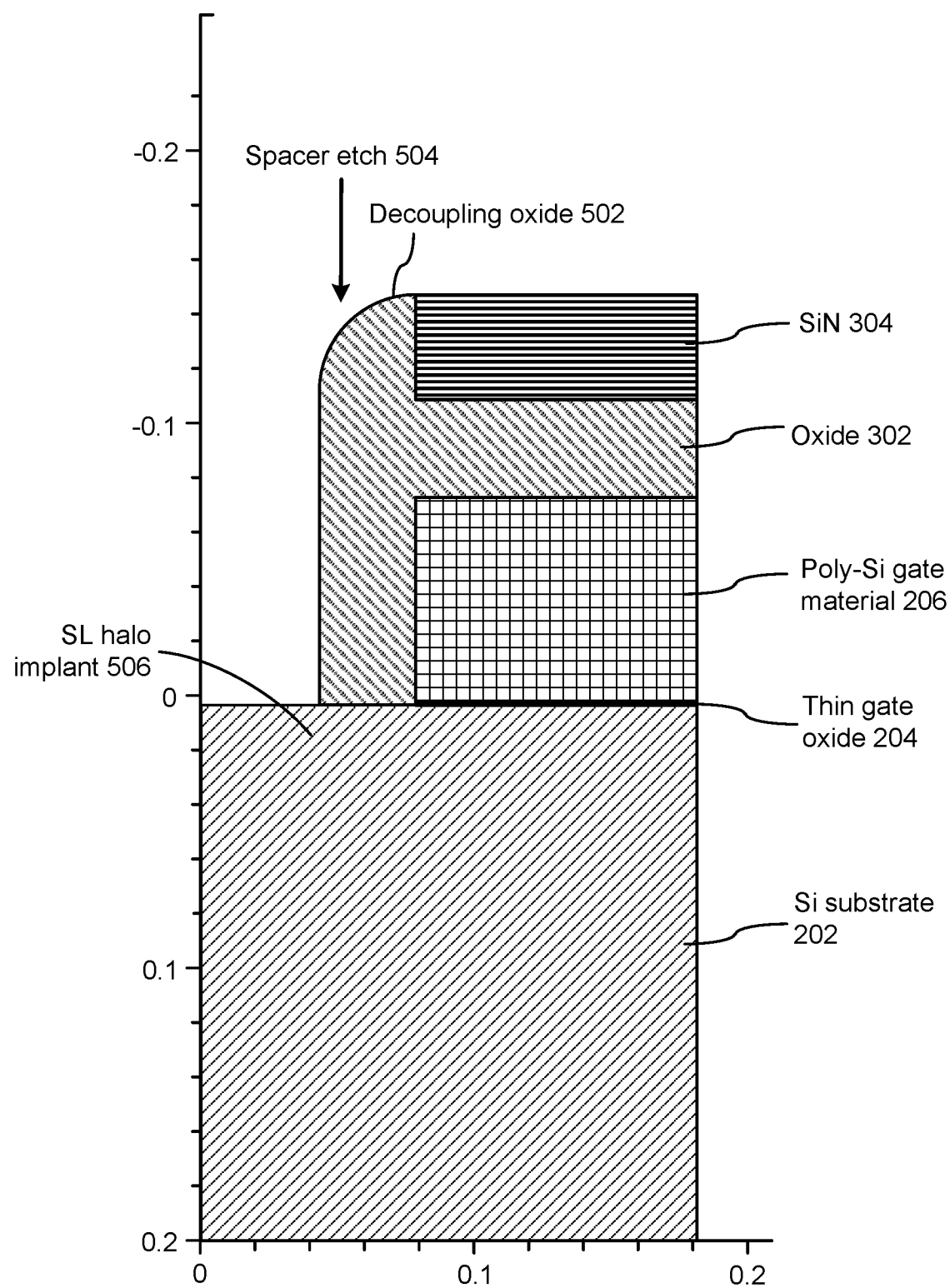

Referring to FIG. 5, a halo implantation creates a source line halo region 506 in the substrate 202 to prevent punch-through. Decoupling oxide 502 is deposited and etched 504, forming a shape that will facilitate the formation of a vertical floating gate with tapered top, as discussed below (see, e.g., FIG. 9, 704).

In the process described in U.S. patent application Ser. No. 16/122,800, the spacer etch is defined by a nitride mask at the top and later etched all the way down (FIGS. 5C-D in that application). In that process, a relatively thick layer (e.g., 1000 Å) of oxide is deposited and etched to form a spacer. As the oxide is etched down and the silicon begins to be etched, various silicon trenches may become non-uniform across the wafer. Some cells may have deeper trenches, other cells may have trenches that are more shallow, leading to uniformity problems across the wafer. However, in embodiments described in this application, a thinner layer of oxide can be deposited (e.g., 350 Å) and etched to form a spacer. As such, for the spacer etch, only that 350 Å of oxide needs to be etched. Since the thinner oxide layer makes it easier to detect the Si surface, embodiments of this process allow for better control of the trench depths across the wafer.

Figure 6:
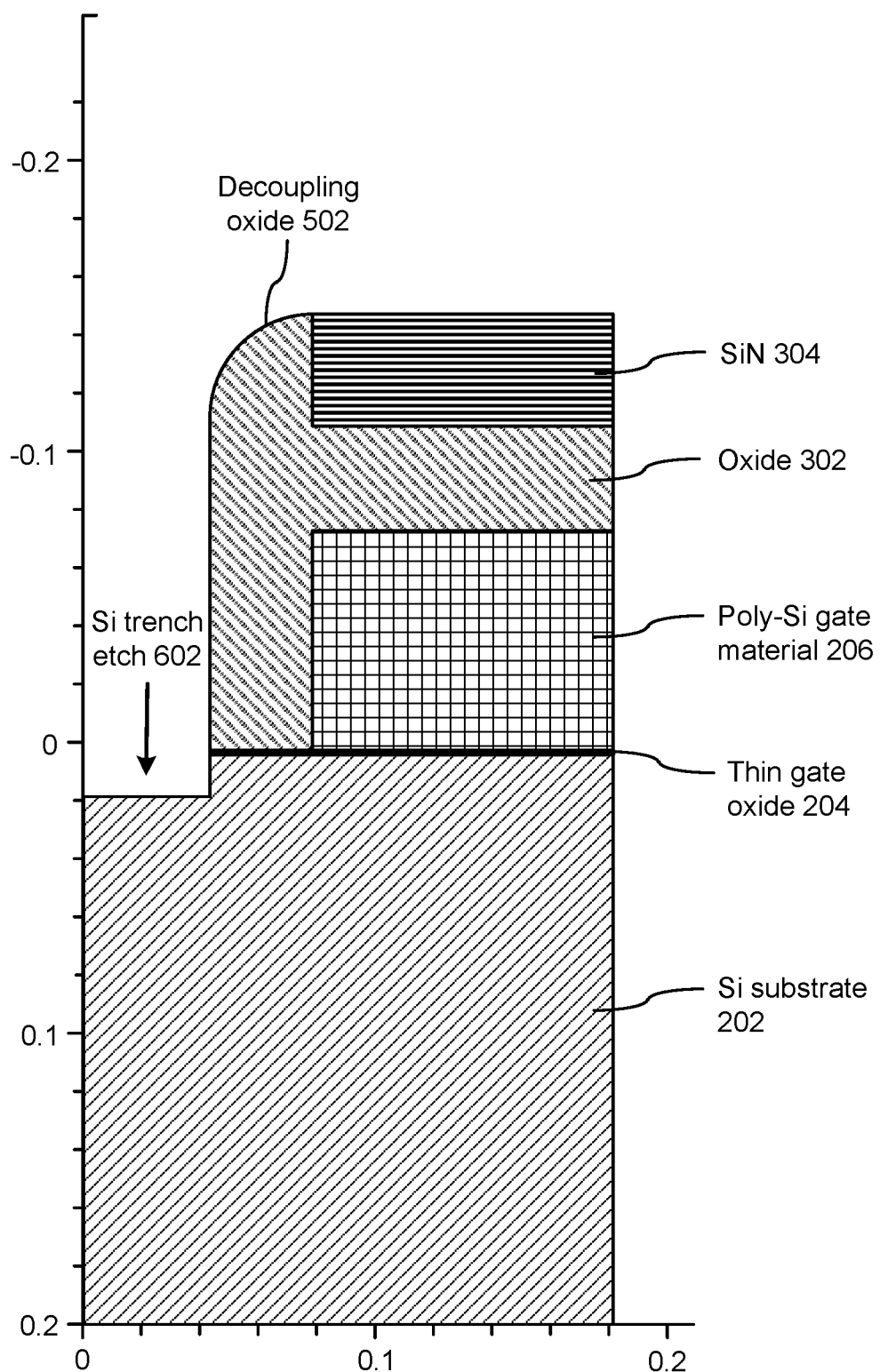

Referring to FIG. 6, the silicon trench 602 is etched. At this point, the gate material 206 that will be used for the word line is already present. In the process described in U.S. patent application Ser. No. 16/122,800, the word line would be deposited as a spacer, formed later in the process. But in the embodiments described in this application, the poly 206 that will form the word line has already been deposited at this point in the process, as is also the case for the gates for peripheral region transistors.

Figure 7:
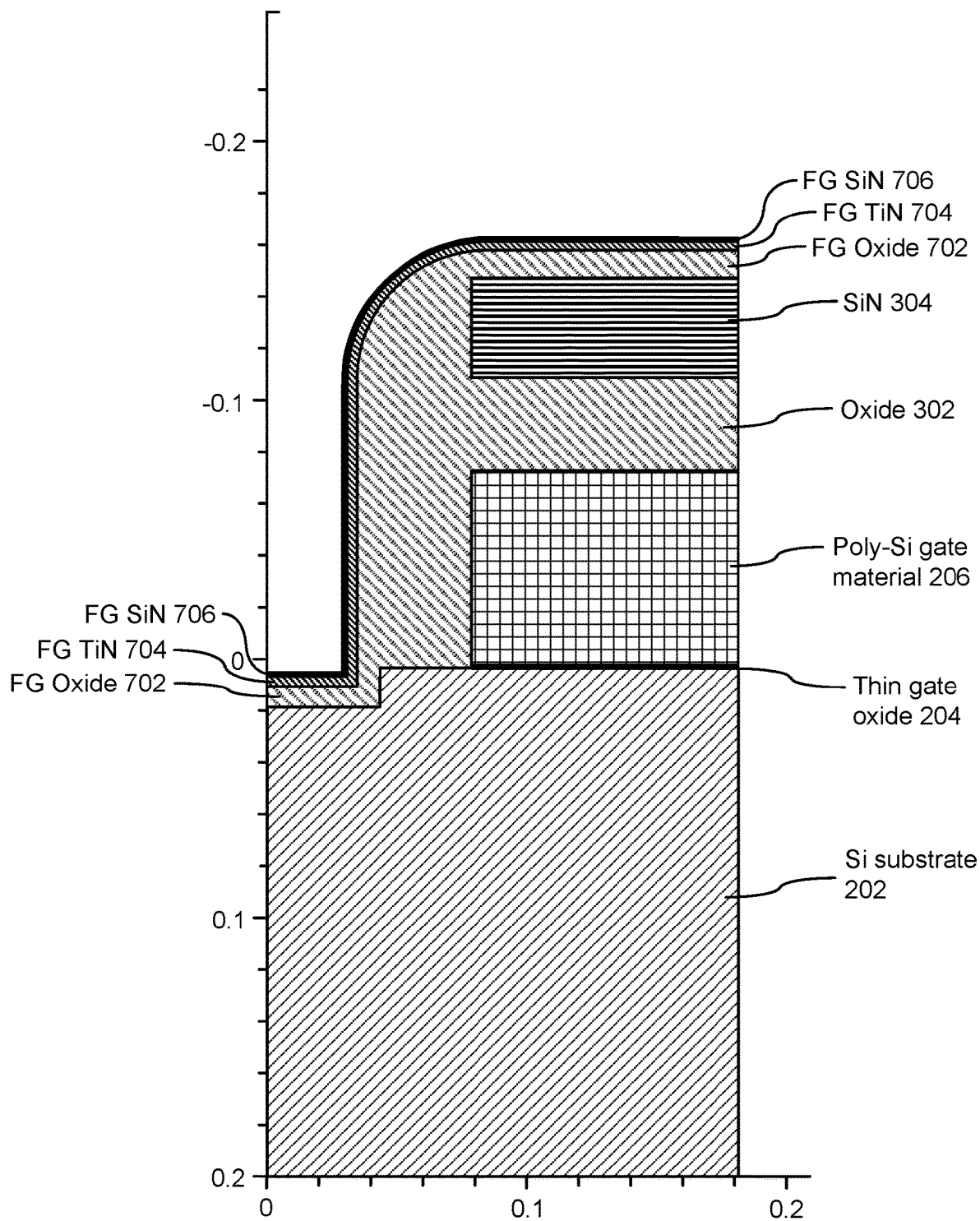

Referring to FIG. 7, the beginning of floating gate formation is depicted. First, an oxide layer 702 (e.g., having a thickness of 80 Å or less), sometimes called a floating gate oxide layer, is deposited. Then, a metal layer 704 (e.g., TiN, having a thickness of 30 Å or less), sometimes called a floating gate metal layer, is deposited. The metal from this layer 704 forms the floating gate. Then, an optional nitride layer 706 (e.g., SiN, having a thickness of 10 Å or less), sometimes called a floating gate nitride layer, is deposited to protect the metal layer 704.

Figure 8:
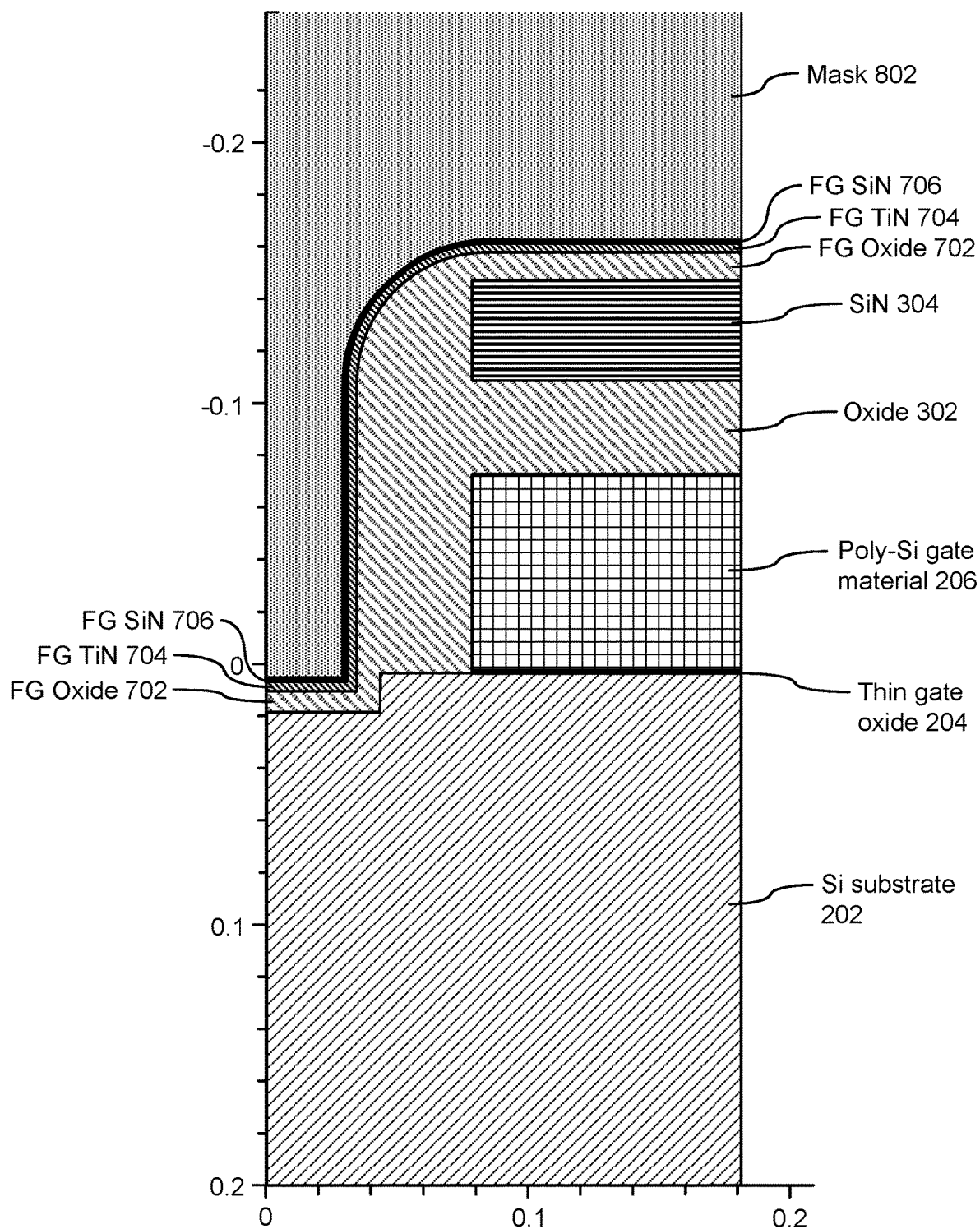

Referring to FIG. 8, a separation mask 802 is deposited, covering the floating gate metal layer 704 and nitride layer 706 for floating gate separation.

Figure 9:
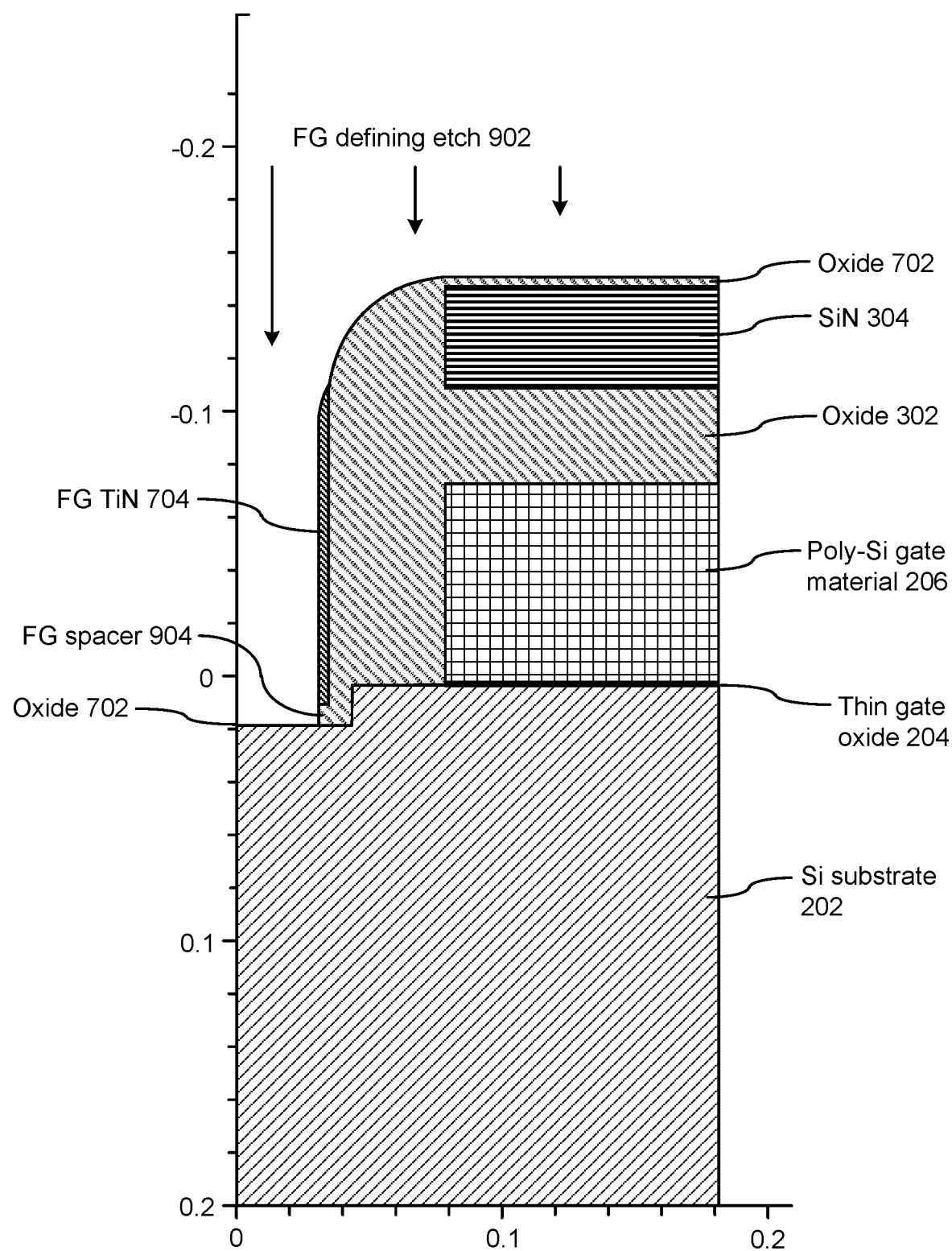

Referring to FIG. 9, the floating gate material 704 is patterned using one or more defining etches 902. In some embodiments, etches 902 etch the floating gate oxide layer 702, the floating gate metal layer 704, and the floating gate nitride layer 706, leaving a region of the floating gate oxide layer 702 disposed (i) underneath the floating gate metal layer 704 and above the trench, and (ii) between the floating gate metal layer 704 and a sidewall of the trench. As a result of the etch(es) 902, there is a vertical floating gate 704 and an oxide spacer region 904 disposed both vertically and horizontally between the floating gate 704 and the substrate 202. In some embodiments, a chemical mechanical polishing (CMP) process is used to set the height of the floating gate 704.

Figure 10:
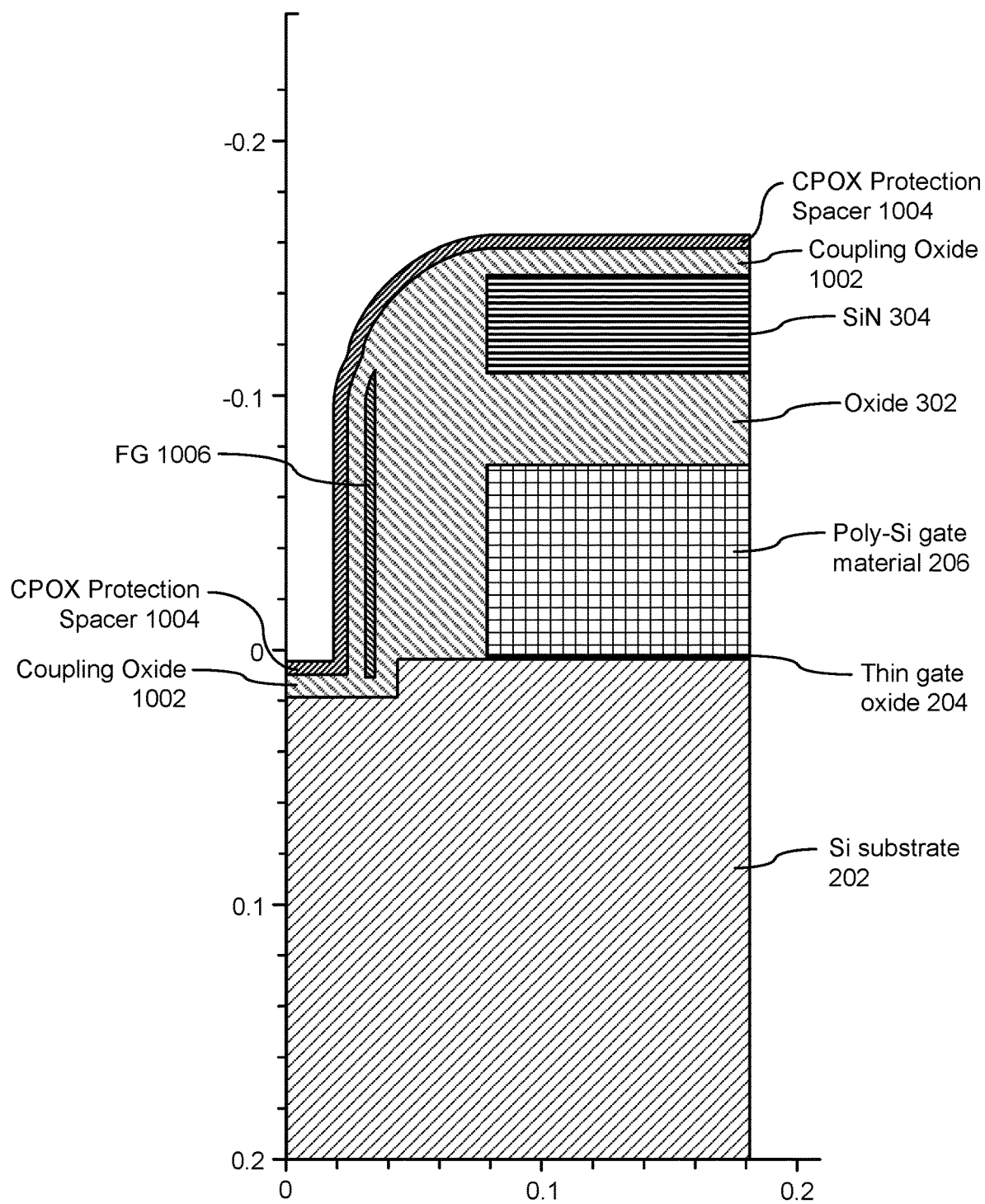

Referring to FIG. 10, first, coupling oxide 1002 is deposited. The coupling oxide is sometimes referred to herein as CPOX, and in some embodiments, is similar to other oxides used in the cell (e.g., oxide 302). Then, a protection layer 1004 (e.g., TiN, 60 Å) is deposited to protect the coupling oxide 1002. The protection layer 1004 is sometimes referred to herein as a CPOX protection spacer or coupling oxide protection spacer. The purpose of the protection layer 1004 is to protect the coupling oxide 1002 adjacent to the floating gate 1006 (corresponding to 704 in previous figures). The coupling oxide 1002 has to be extra clean. More specifically, if any impurities enter the coupling oxide 1002 (e.g., from subsequent etching), this may cause charge leakage issues. Therefore, once the coupling oxide 1002 is deposited, another layer (1004) is immediately deposited to protect it.

Figure 11:
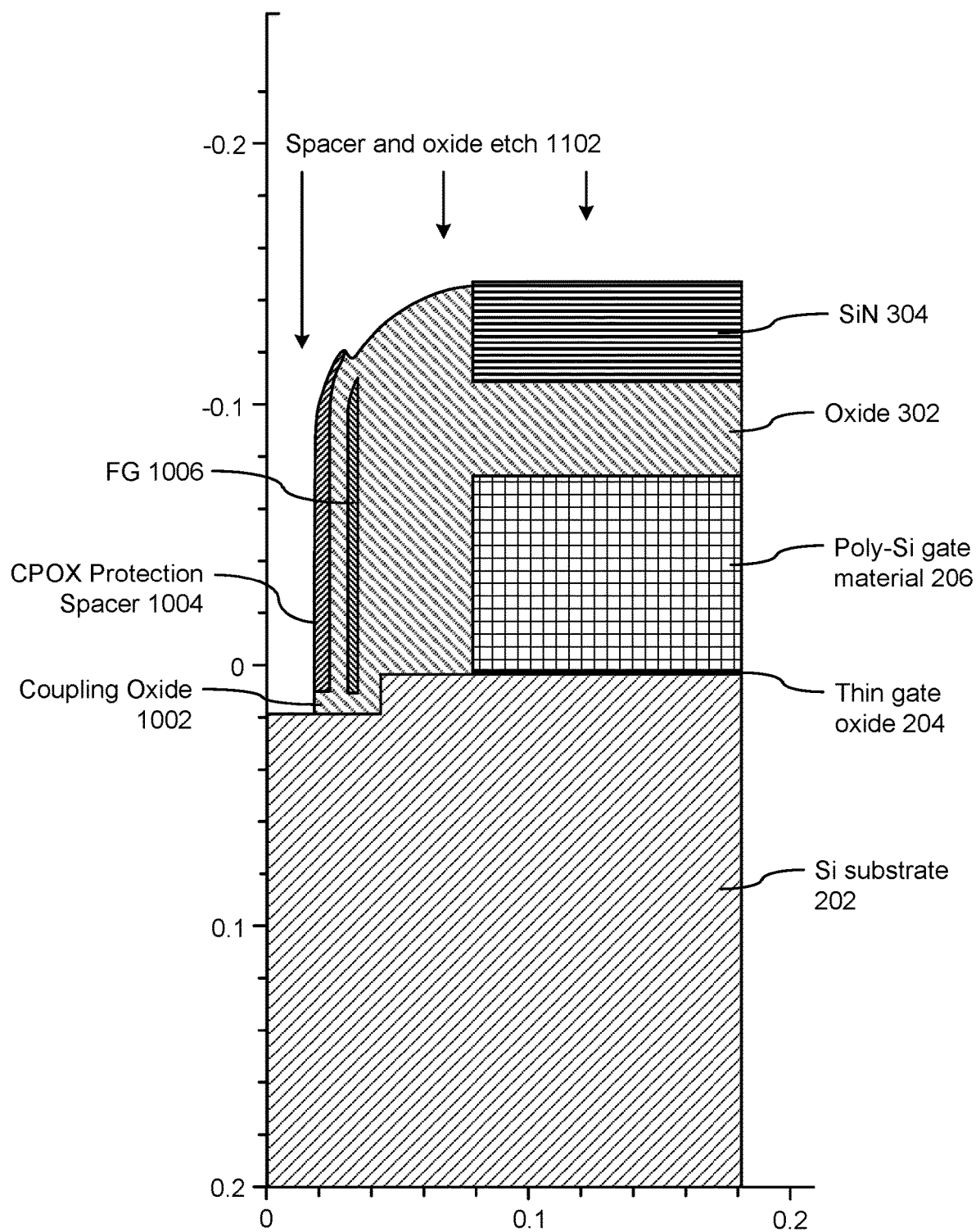

Referring to FIG. 11, the protection layer 1004 and the coupling oxide 1002 are etched (1102). In some embodiments, the etch is anisotropic, and does not etch the vertical portion of protection layer 1004, also referred to as the coupling oxide protection spacer 1004, but etches a top portion of the protection spacer 1004 and proceeds all the way to the silicon substrate 202 at the bottom of the trench. As a result, a portion of the trench adjacent to the coupling oxide 1002 and the coupling oxide protection spacer 1004 is exposed, and the nitride layer 304 over the first stacking oxide layer 302 is exposed.

Figure 12:
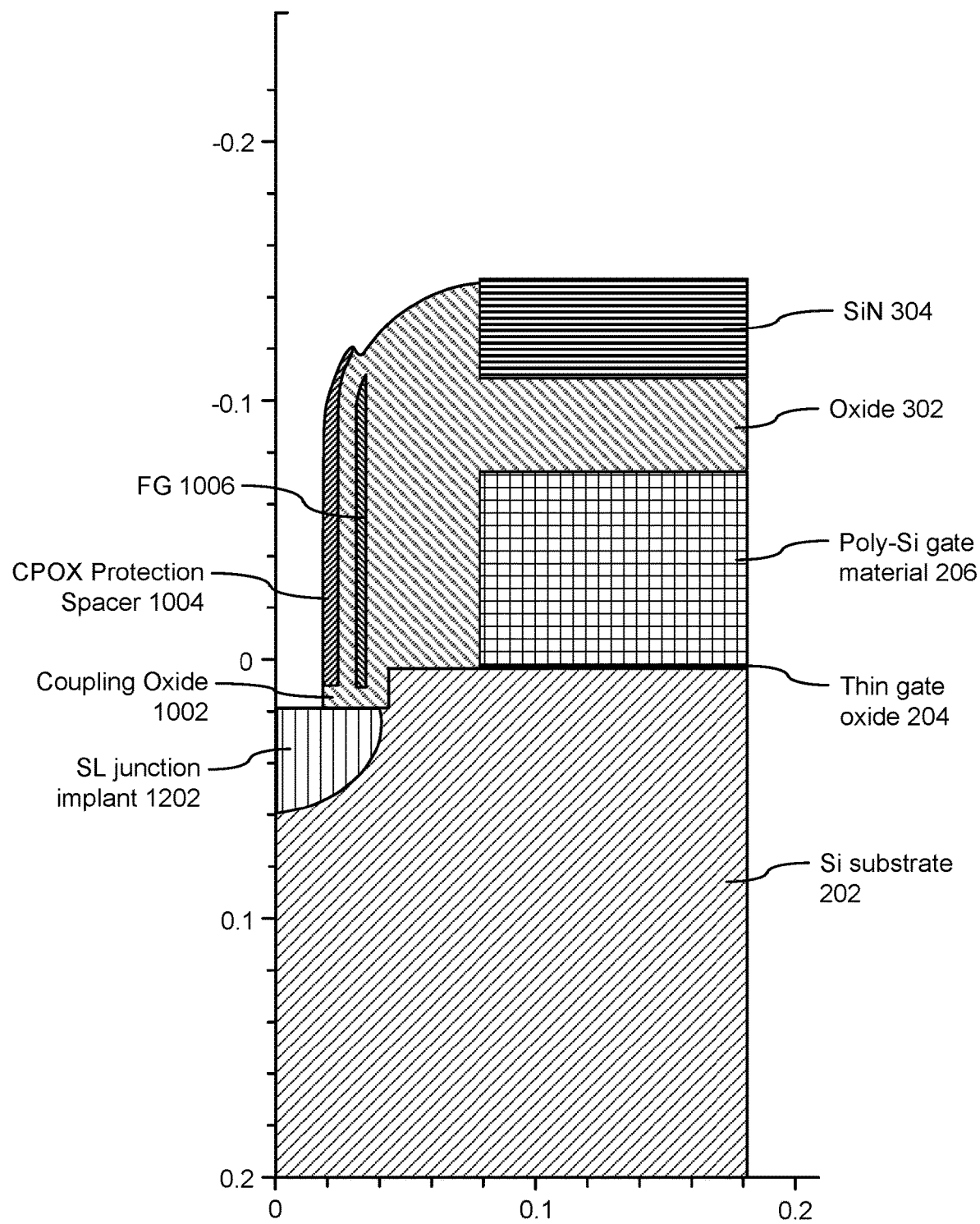

Referring to FIG. 12, a source line junction implant is performed, forming source line junction implant region 1202 in the silicon substrate 202, and the implant is annealed.

Figure 13:
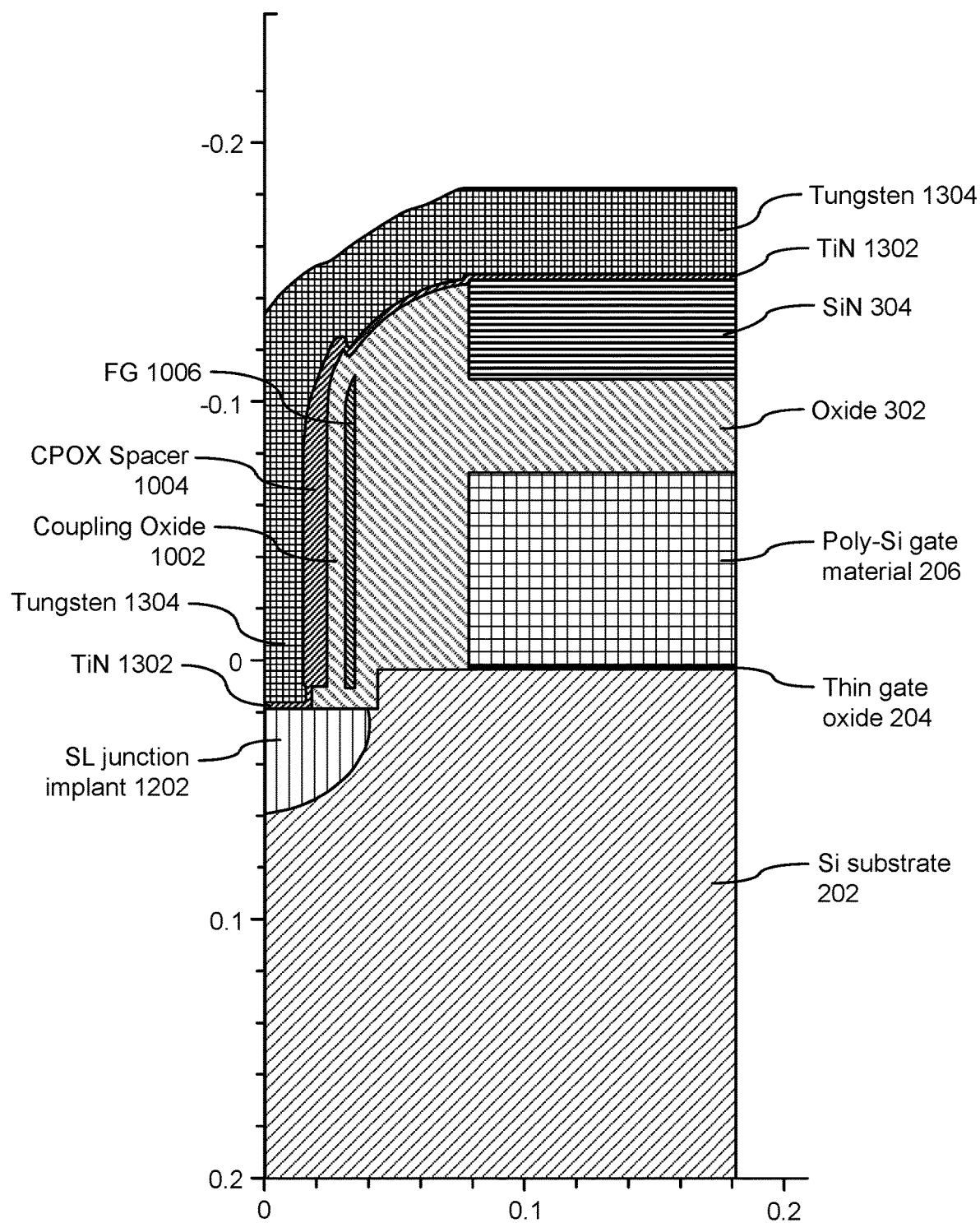

Referring to FIG. 13, a barrier layer (e.g., TiN) 1302 is deposited, and then source line gate material 1304 (e.g., tungsten or polysilicon) is deposited. The additional TiN 1302, before the tungsten deposition, prevents direct contact between the tungsten and the silicon, which may cause undesirable behavior.

Figure 14:
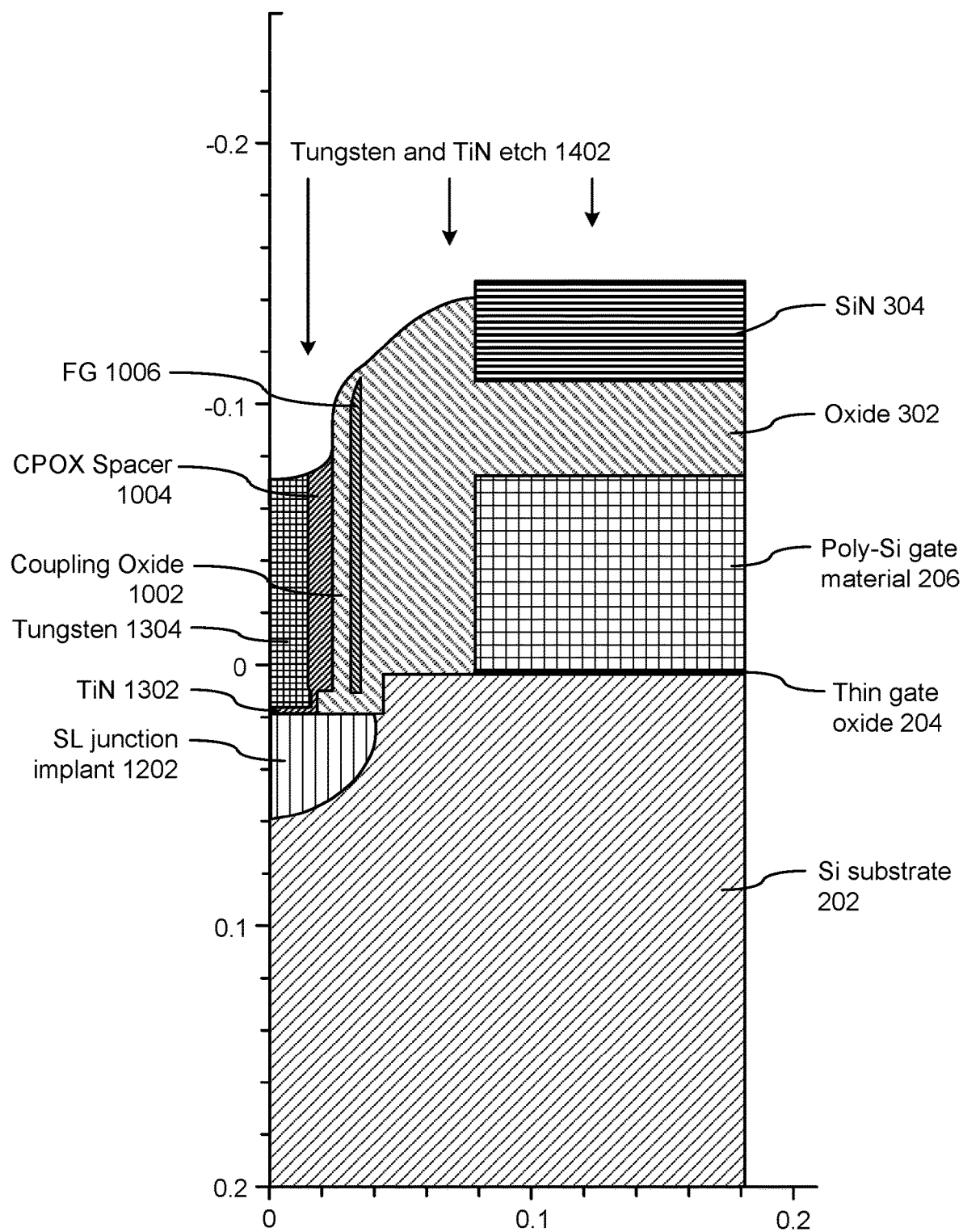

Referring to FIG. 14, the tungsten 1304 and TiN 1302 layers are etched back (1402) to form source line 150 (FIG. 1A).

Figure 15:
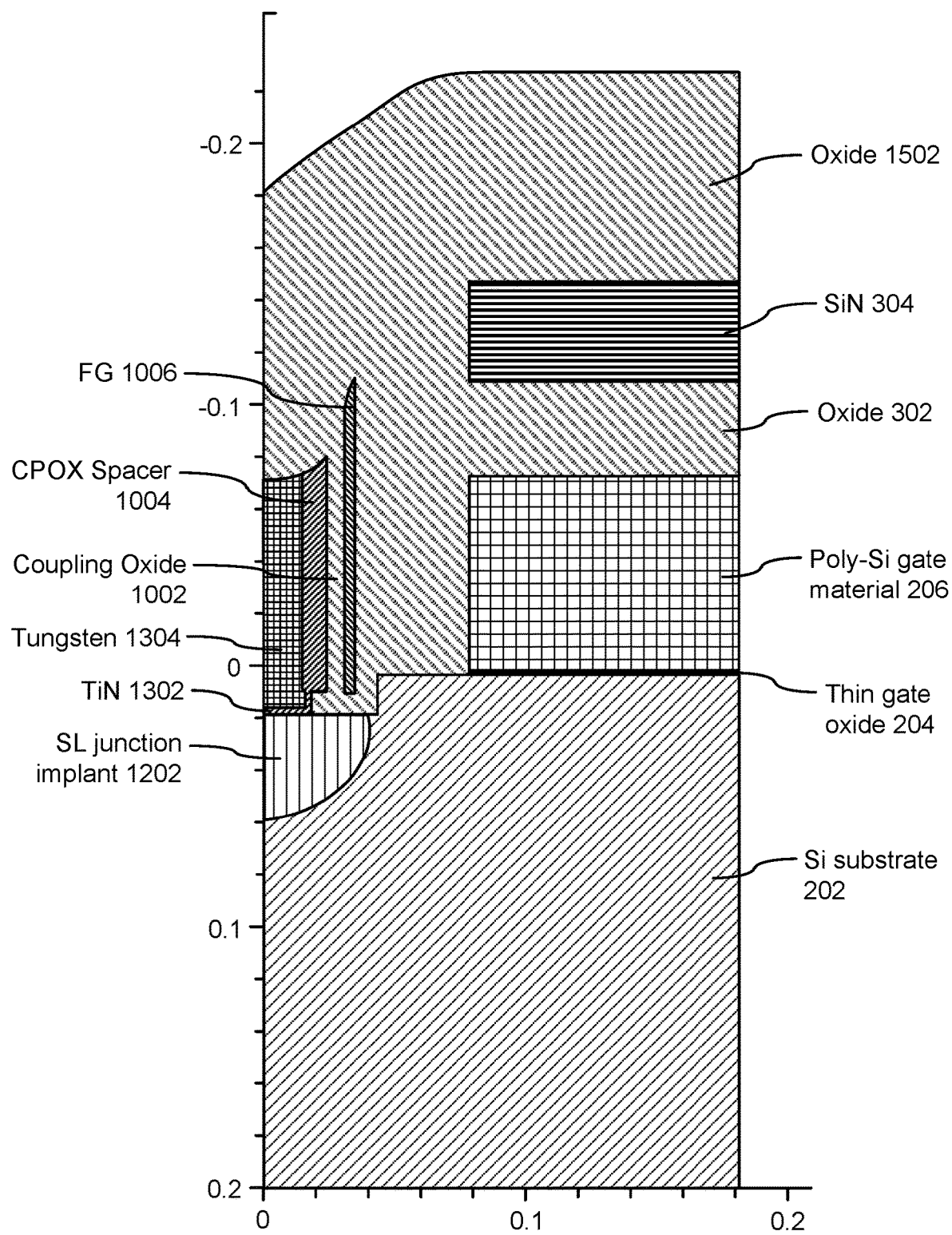

Referring to FIG. 15, another layer of oxide 1502, sometimes called a second stacking oxide layer, sometimes called a planarizing oxide layer, is deposited; the purpose of this oxide layer is to fill in the gaps left over from the previous etch (1402).

Figure 16:
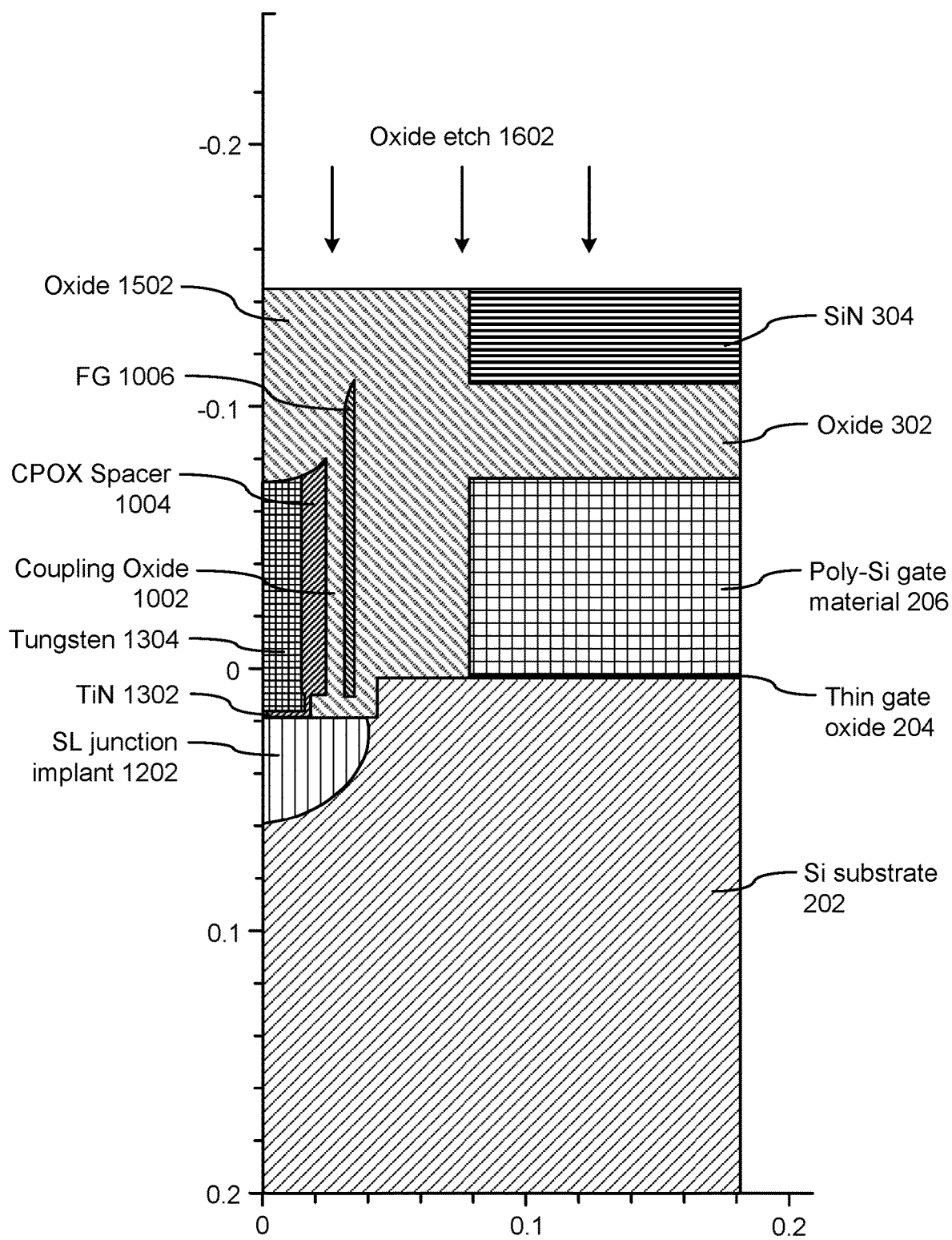

Referring to FIG. 16, the oxide 1502 is etched back (1602) using, e.g., a CMP process, resulting in formation of a flat surface (sometimes referred to as planarizing).

Figure 17:
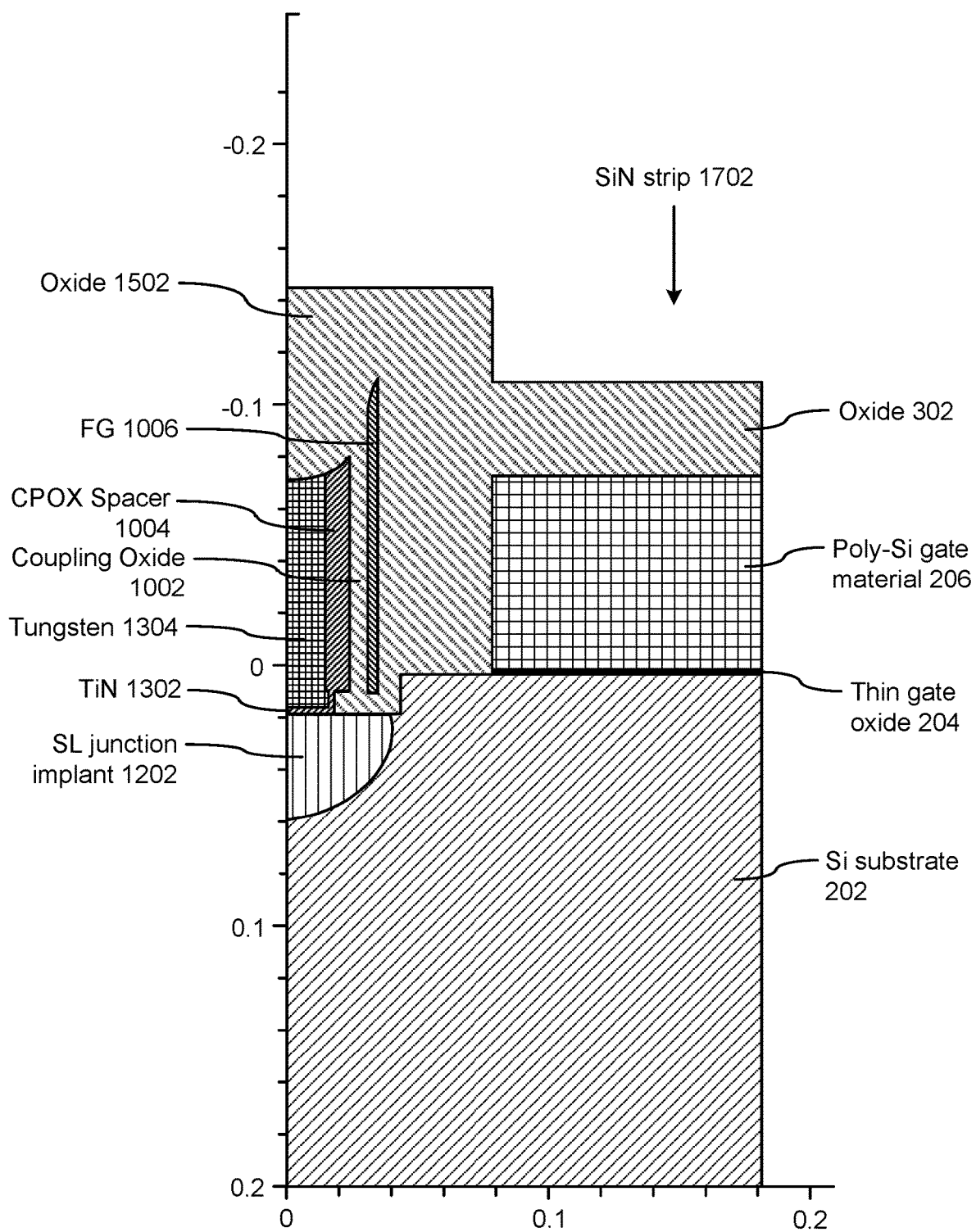

Referring to FIG. 17, after planarizing, the nitride 304 is removed by, e.g., using a stripping process 1702.

Figure 18:
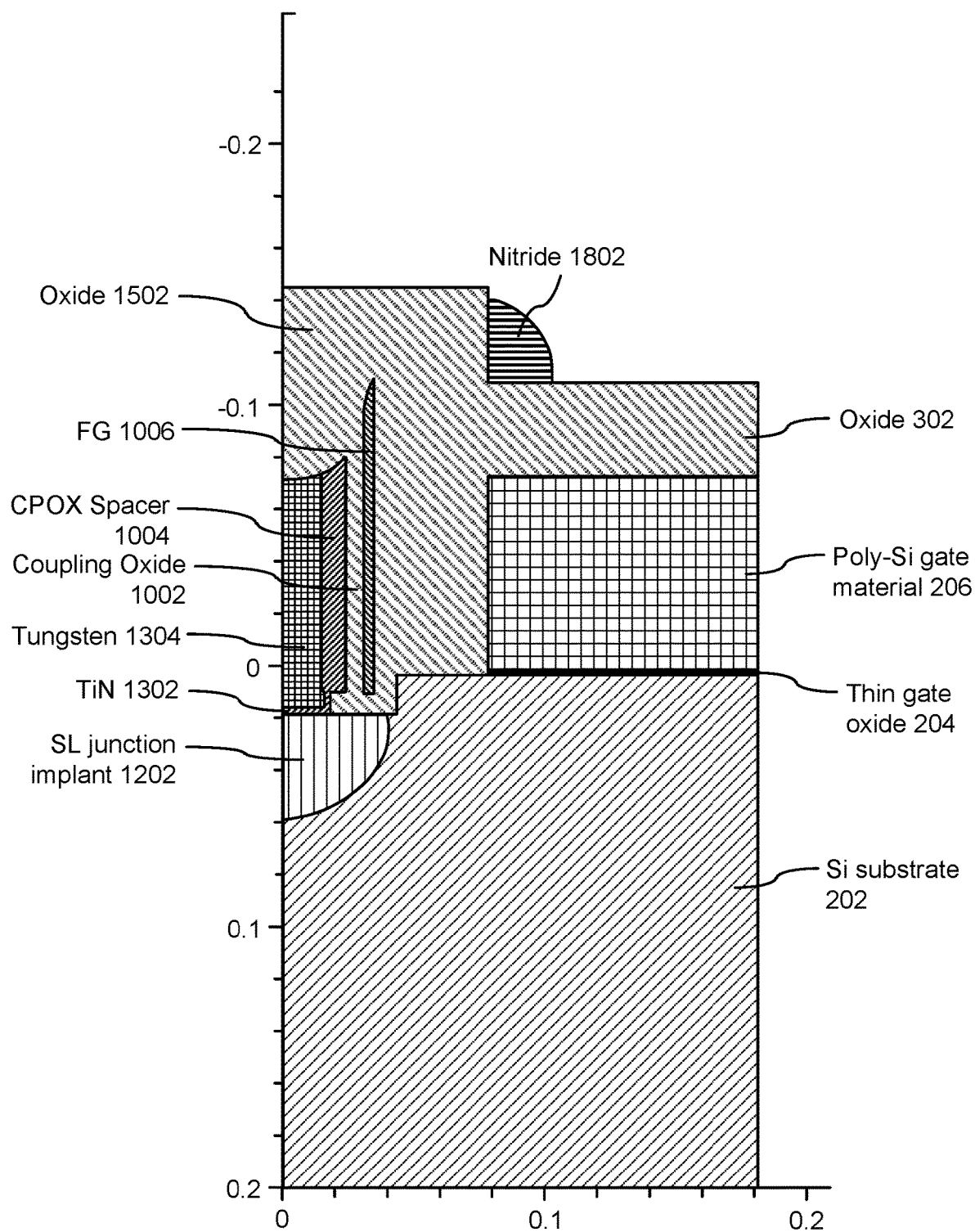

Referring to FIG. 18, a layer of nitride is deposited in the original location of the nitride 304 (which has since been removed). Then, the nitride is etched away (e.g., using an anisotropic etching process) to form a nitride spacer 1802 (e.g., having a width of 250 Å or less). In a later step, nitride space 1802 is used to form a word line spacer (sometimes called a gate spacer portion of an oxide layer), used to define word line 120 of the memory cell.

Figure 19:
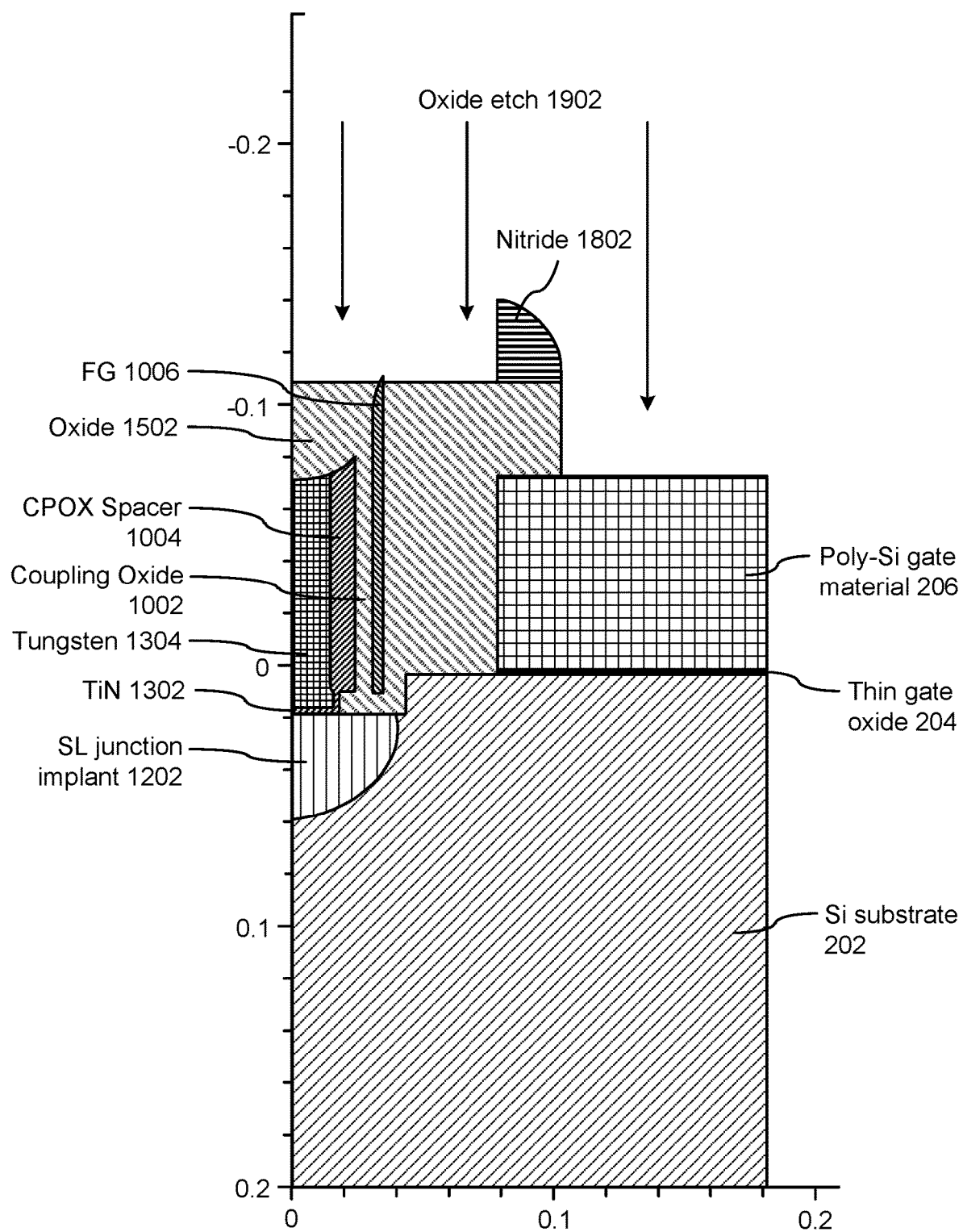

Referring to FIG. 19, the oxide 1502 and 302 (see FIG. 18) are etched (1902), leaving behind the nitride spacer 1802.

Figure 20:
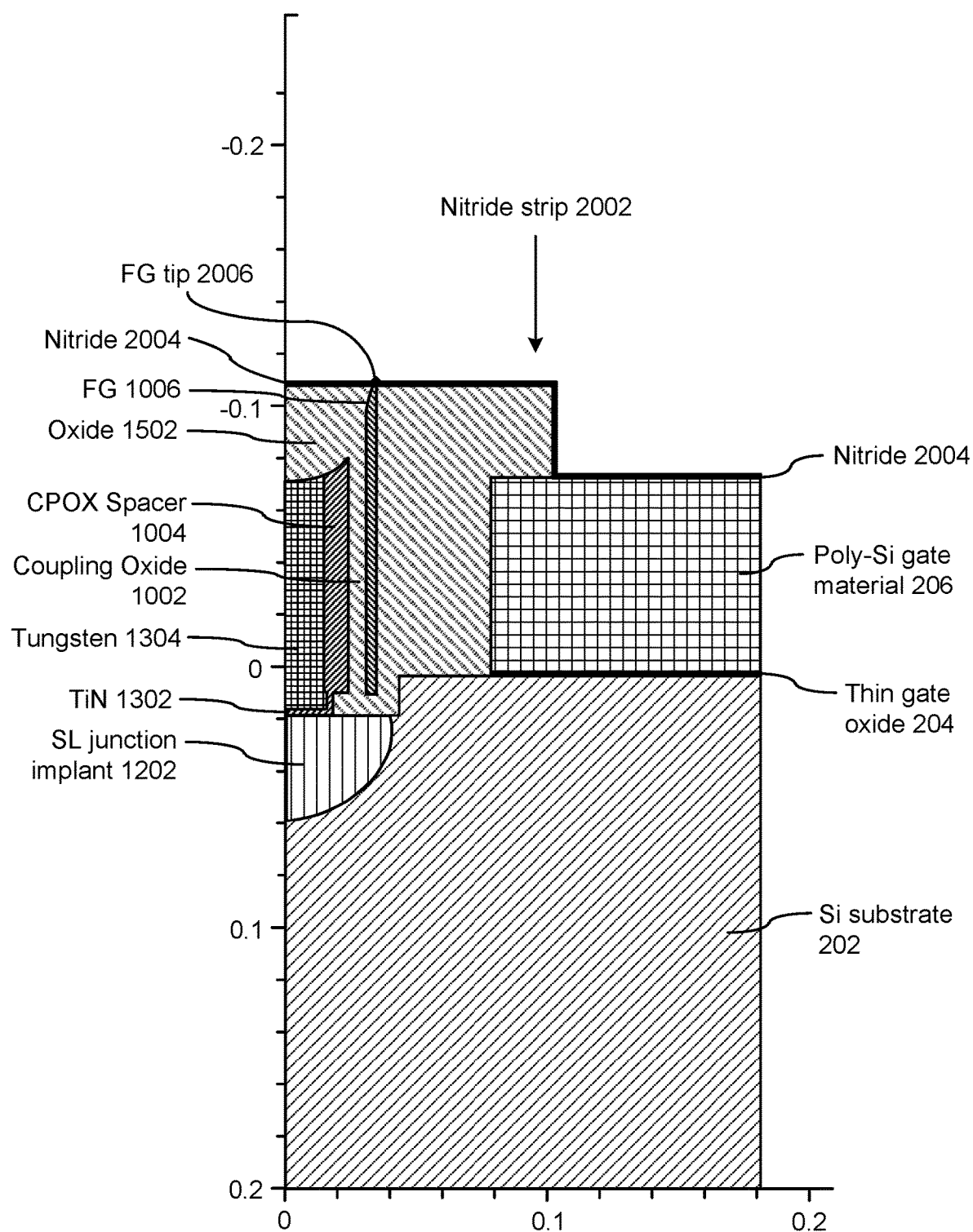

Referring to FIG. 20, the nitride spacer 1802 (see FIG. 19) is stripped (2002), exposing a portion of the first stacking oxide layer overlying a portion of the gate conductor material (e.g., poly) 206 that will form the word line. This portion of the first stacking oxide layer is sometimes called a gate spacer, word line spacer, first word line spacer, or word line spacer portion of the first stacking oxide layer. Then, a nitride layer 2004 (e.g., ALD (atomic layer deposition) nitride, 10 Å) is optionally deposited in order to seal the floating gate tip 2006.

Figure 21:
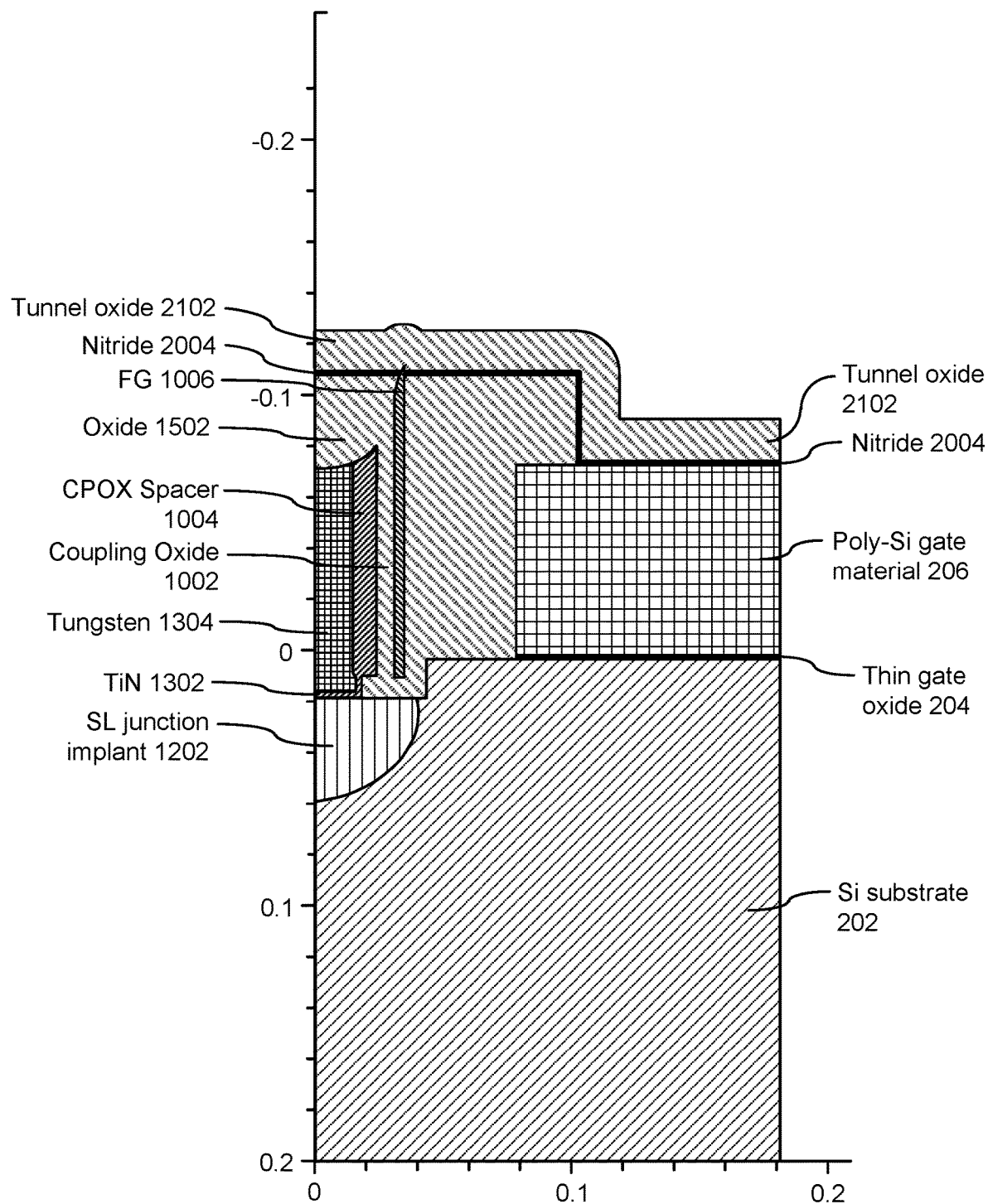

Referring to FIG. 21, a tunneling dielectric layer 2102 (e.g., tunneling oxide) (e.g., having a thickness of 300 Å or less, such as 150 Å) is deposited. The tunneling dielectric layer is for electron tunneling between the floating gate 1006 and the erase gate, which will be described below (see FIG. 28, erase gate poly 2808).

Figure 22:
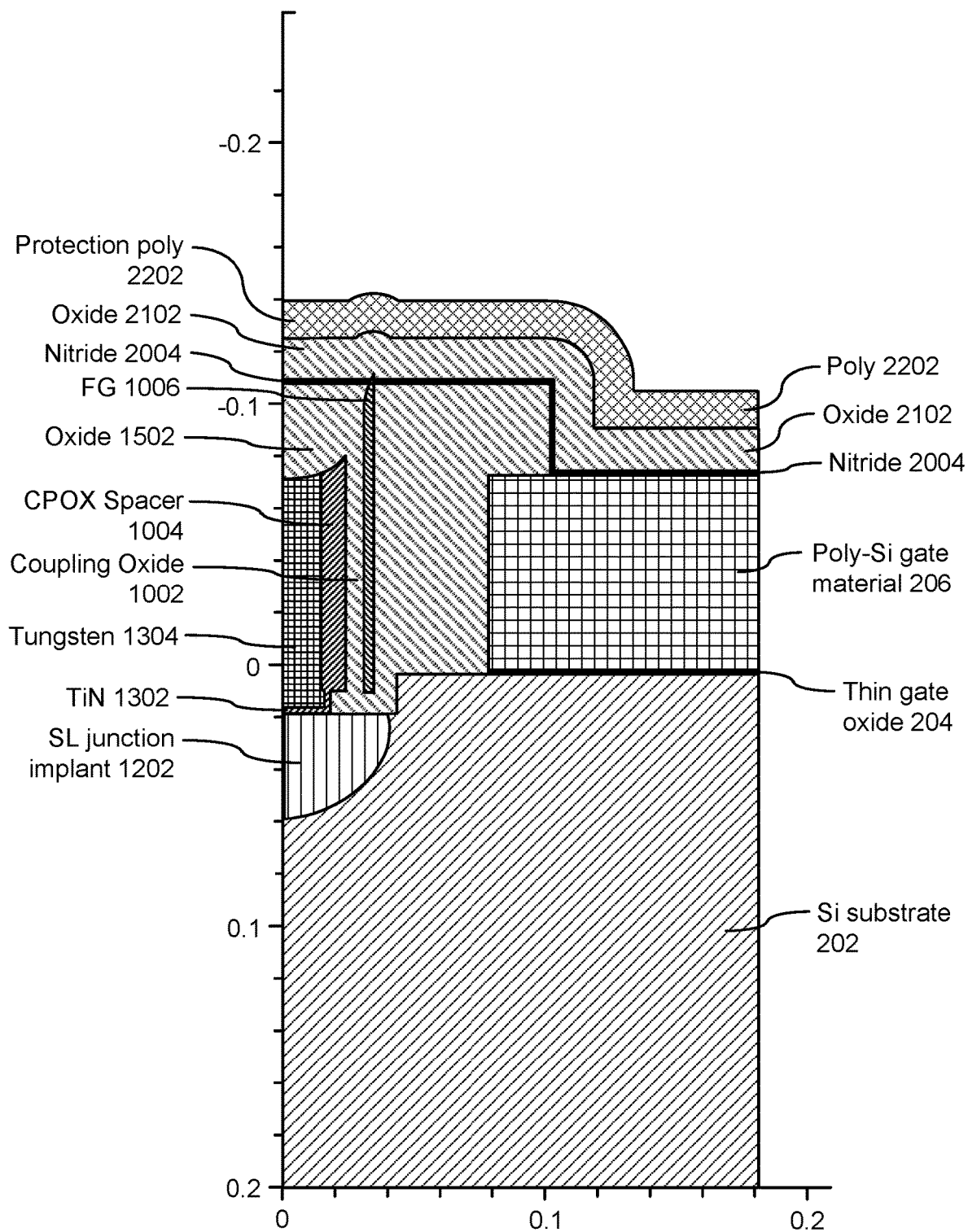

Referring to FIG. 22, a protection layer of poly 2202 is deposited over the oxide layer 2102. Since the purity of each oxide layer surrounding the floating gate is critical (as discussed above), the oxide needs to be protected. Here, the oxide 2102 is protected with poly material 2202.

Figure 23:
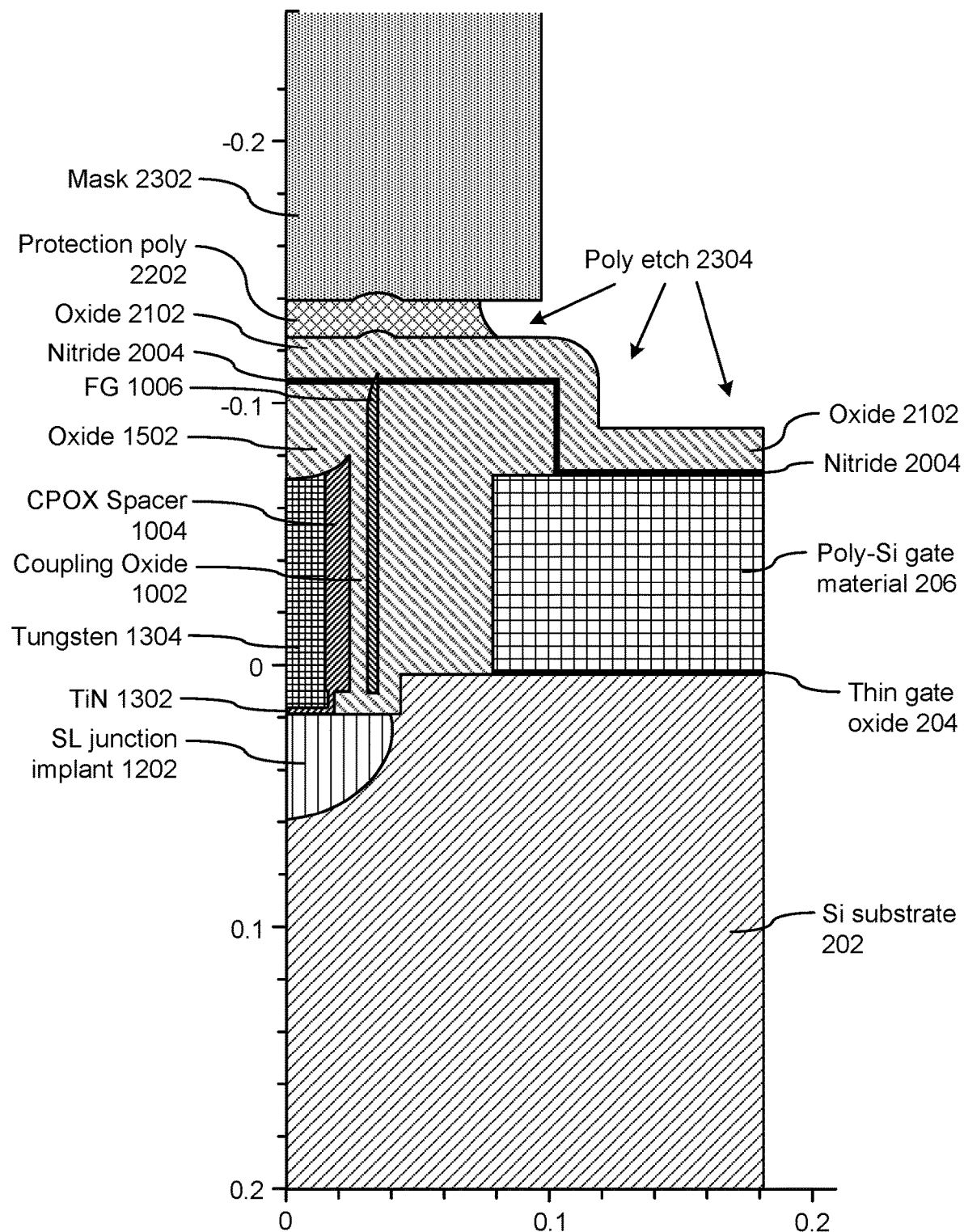

Referring to FIG. 23, the protection poly 2202 is etched 2304 using, e.g., a resist mask 2302 (e.g., isotropically etched), leaving a portion of the protection poly 2202 protected by the resist mask 2302.

Figure 24:
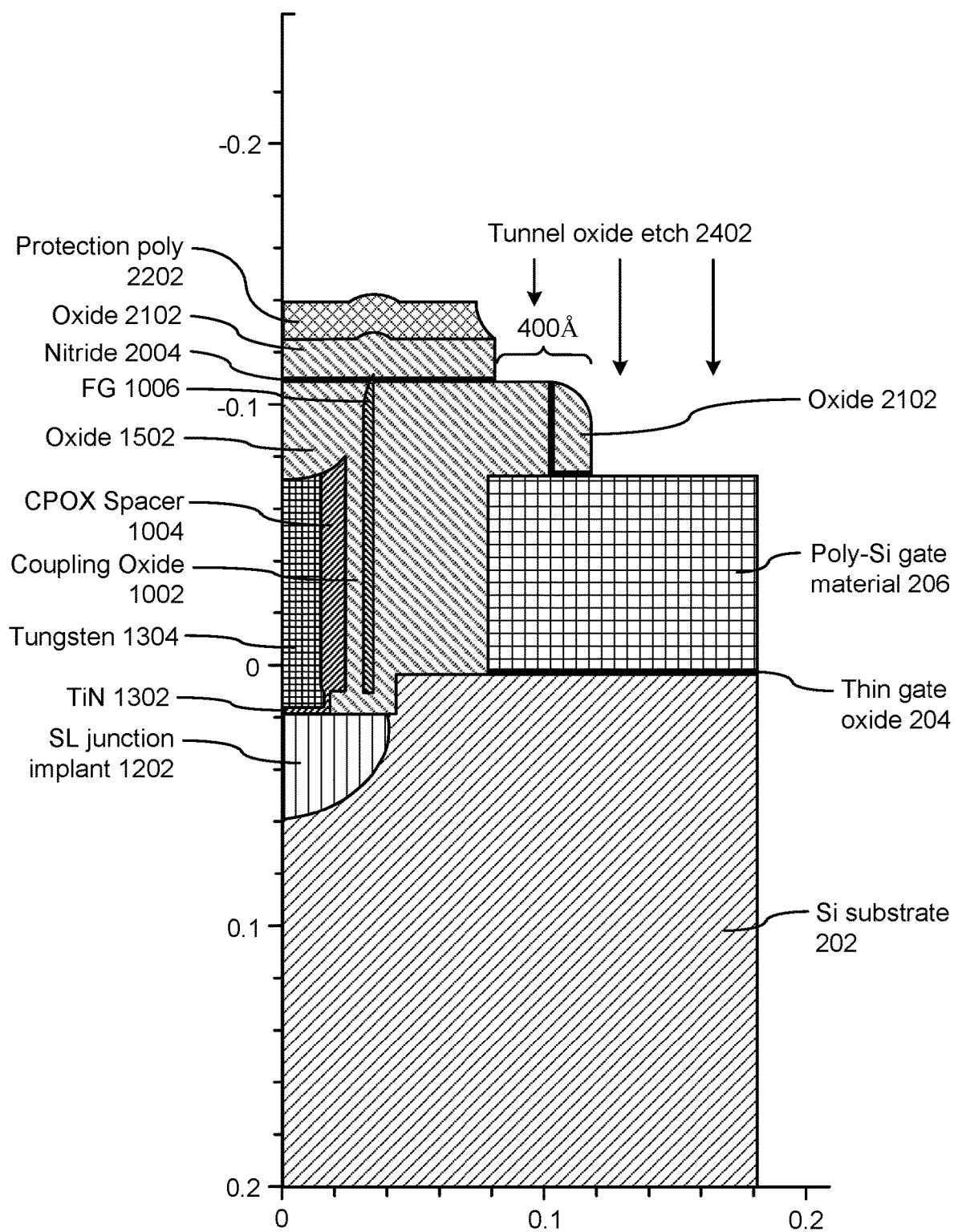

Referring to FIG. 24, while the resist mask 2302 is still present (e.g., the resist is used as a mask instead of the poly 2202 because the poly is very thin), the tunnel oxide 2102 is etched (2402) (e.g., anisotropically) to expose the word line poly 206. The etch also removes exposed portions of nitride 2004 (i.e., the portions of nitride 2004 not covered by poly 2202). The portion of the tunneling oxide 2102 remaining over poly material 206 is sometimes called a gate spacer, or word line spacer or second word line spacer. The resist mask 2302 is then removed. In some embodiments, the width of the oxide, sometimes called a combined word line spacer, over the region of poly material 206 that will become the word line is approximately 400 Å (e.g., 250 Å or less of oxide 1502 (sometimes called the first word line spacer) and approximately 150 Å of oxide 2102 (sometimes called the second word line spacer)). This 400 Å of oxide spacer is used as a mask to define the word line later (see FIG. 26, 206A).

Figure 25:
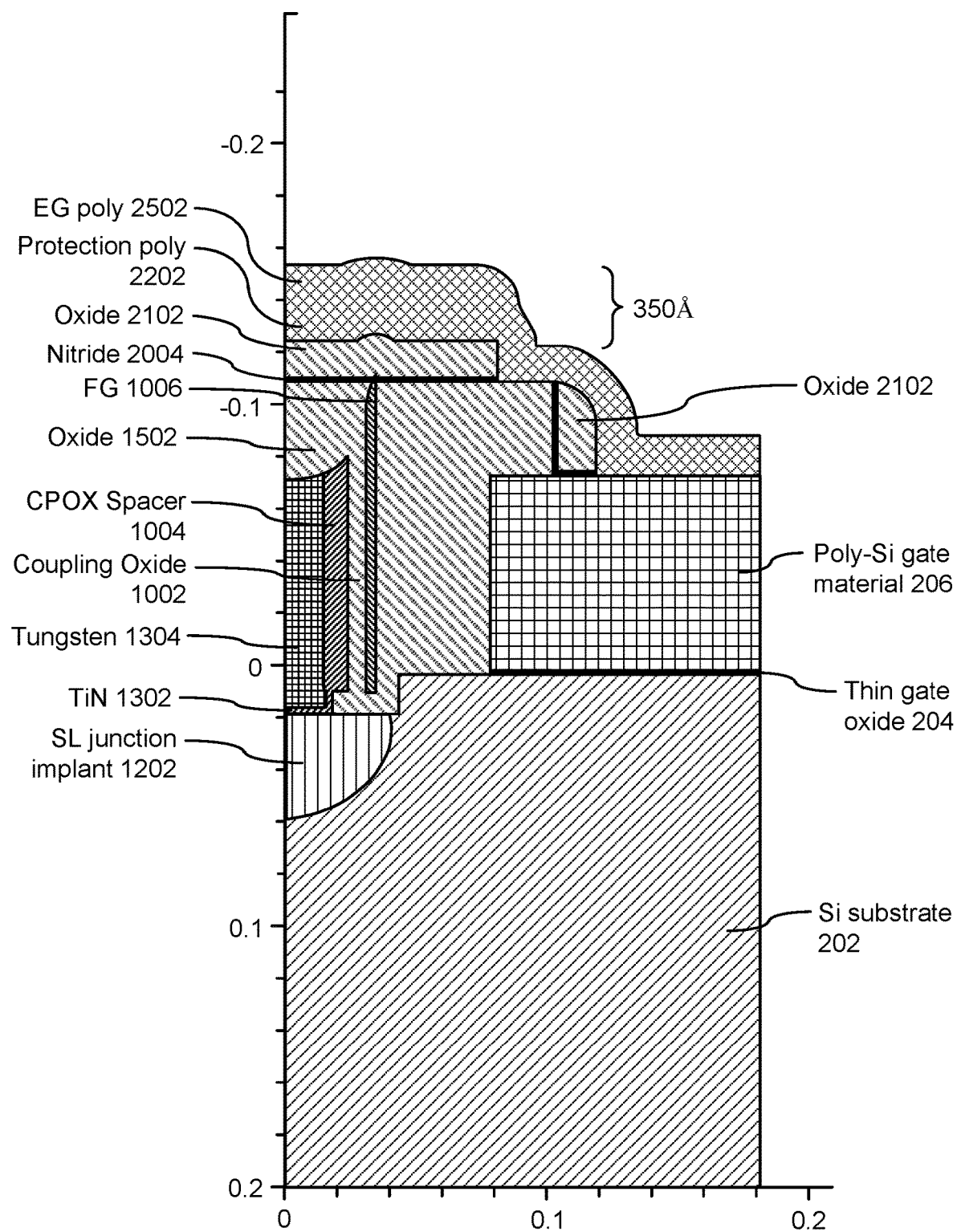

Referring to FIG. 25, another layer of poly 2502, sometimes called erase gate polysilicon, is deposited. There are two layers of poly (protection poly layer 2202 and additional poly layer 2502) (e.g., each approximately 150 Å thick) over the floating gate tip and the tunneling oxide 2102. In some embodiments, combined, the two layers of poly are approximately 300 Å thick. These poly layers will eventually become the erase gate (see FIG. 28, 2808).

Figure 26:
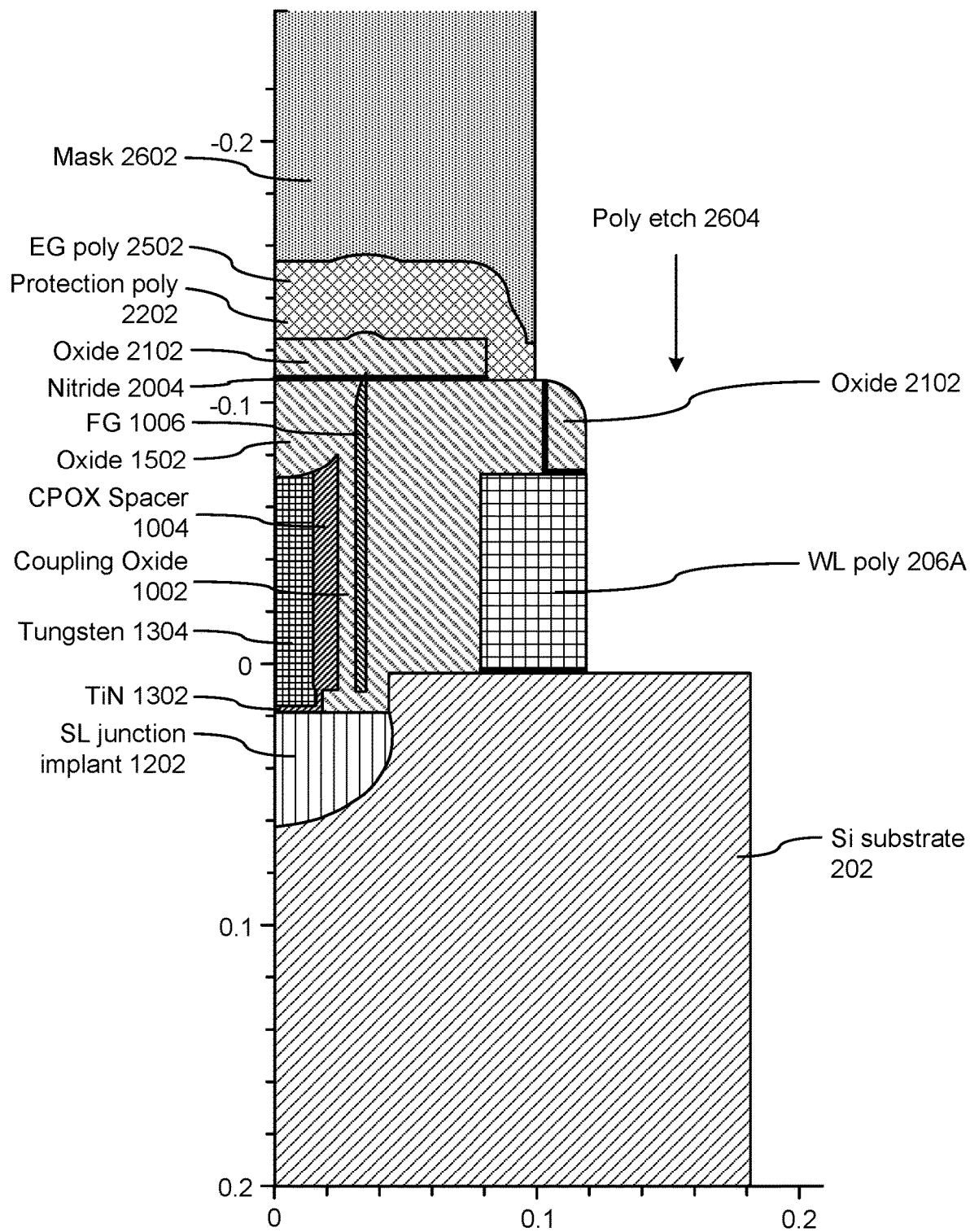
Figure 31:
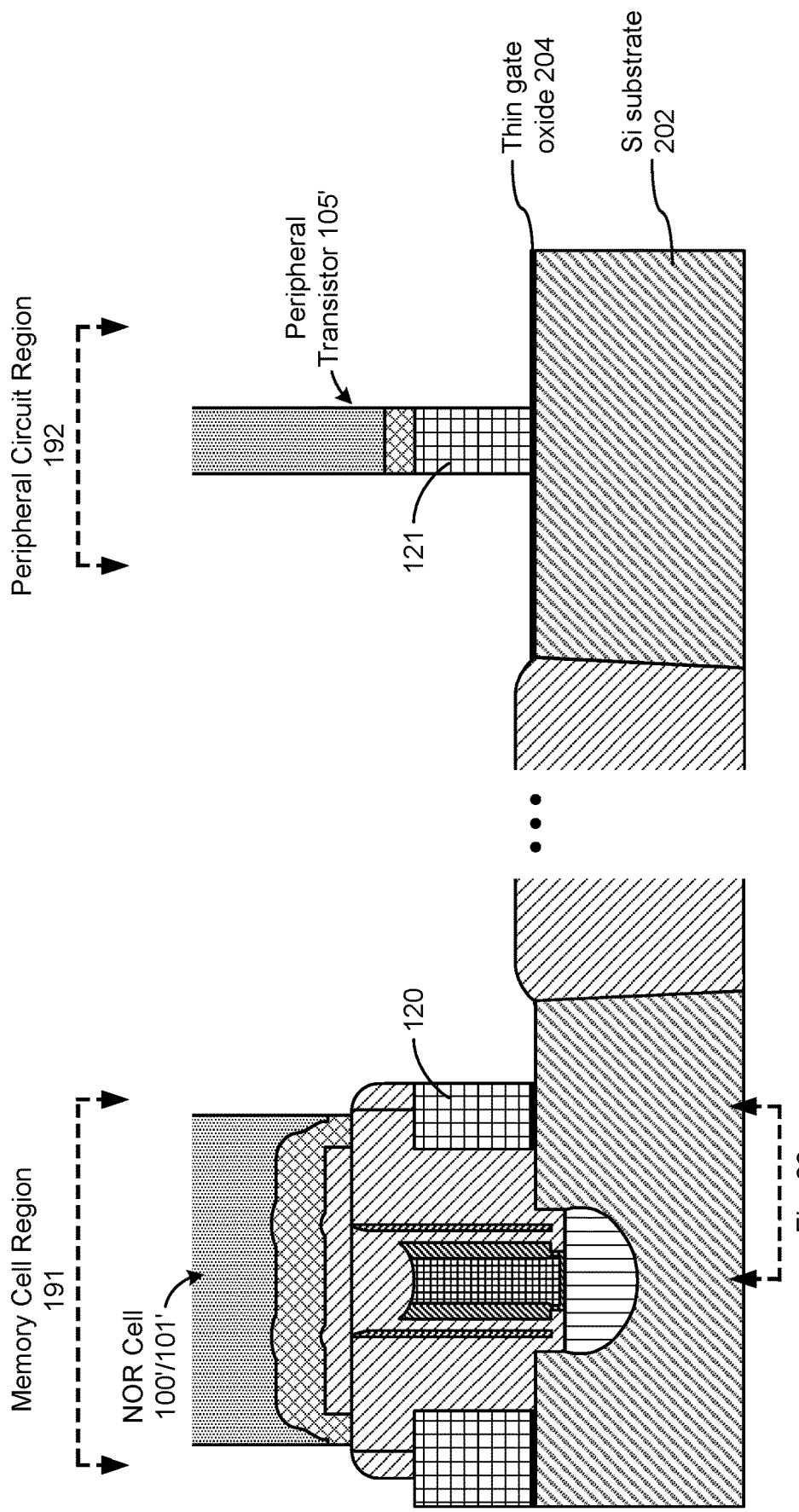
Figure 32:
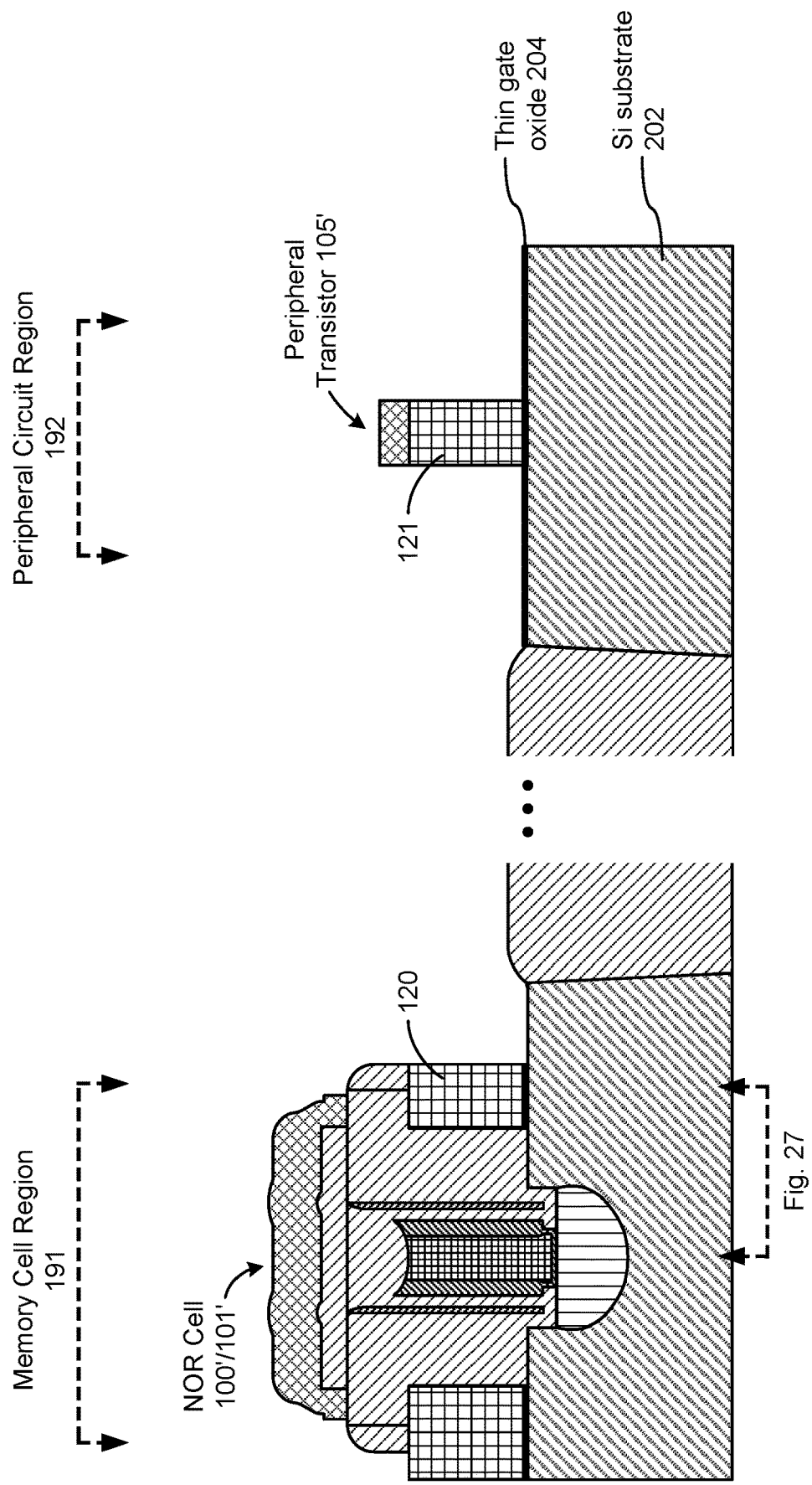
Figure 33:
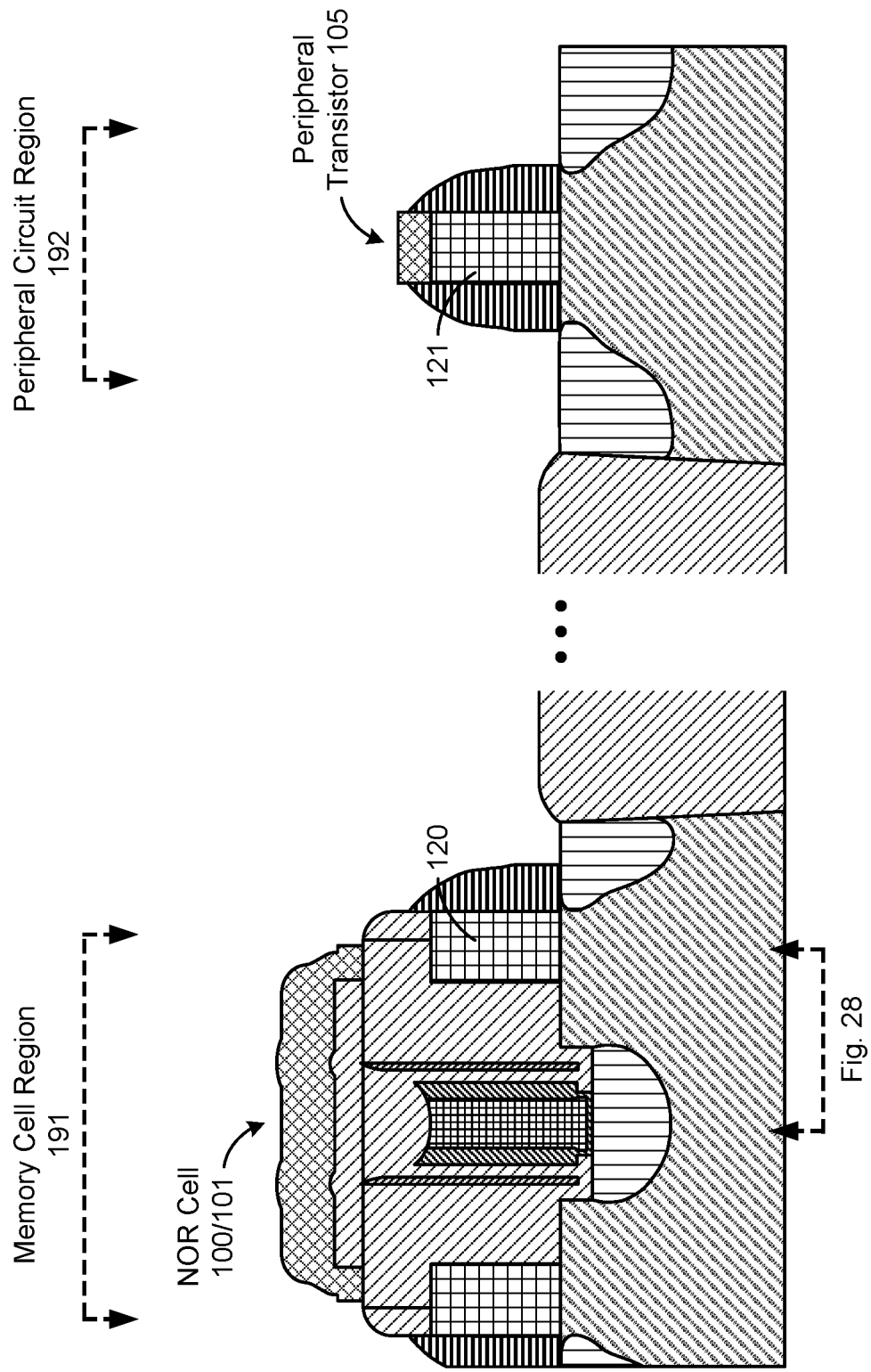

Referring to FIG. 26, using a mask 2602 to define the erase gate (2202 and 2502) and one or more peripheral transistor gates (not shown), the poly gate material 206 (FIG. 25) is etched (2604) to form word line poly 206A (FIG. 26, corresponding to gate 120 in FIG. 31) and peripheral transistor gate poly 121 (FIG. 31). The word line gate 206A is defined at this step (until now, there was no definition of the word line gate). The peripheral transistor gate 121 (FIG. 31) is concurrently defined at this step. The same etch also etches portions of additional poly layer 2502 exposed by mask 2602, thereby defining the lateral extent of the erase gate 170 (FIG. 1A).

In previous fabrication processes (e.g., the process described in U.S. patent application Ser. No. 16/122,800), the process may have started at the steps shown in FIG. 2 and continued with the word line poly definition step shown in FIG. 26. However, for embodiments described in this application, the steps shown in FIGS. 3-25 are inserted between the steps described in FIGS. 2 and 26 in order to form the rest of the memory cell before the word line poly 206A (120 in FIG. 31) is defined and separated from peripheral transistor poly 121 (FIG. 31). Since the word line is formed using the oxide 1502 and 2102 above it as a mask during the etching 2604, the word line is self-aligned. On the other hand, the erase gate and peripheral gate are defined by the resist mask 2602 (FIG. 26).

Figure 30:
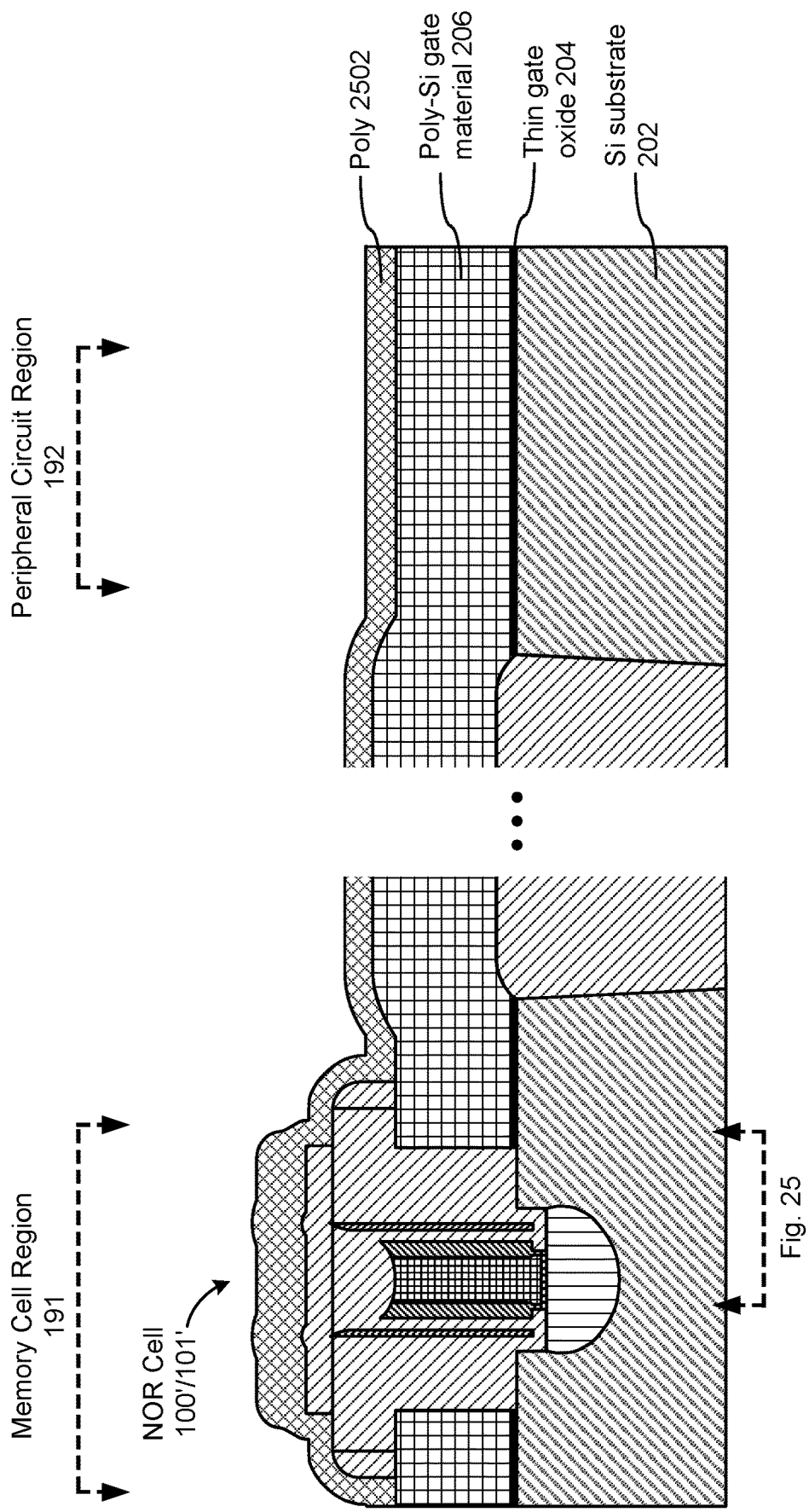

FIGS. 30 and 31 include expanded views of FIGS. 25 and 26, including memory cells 100' and 101' (designated as such because the cells 100 and 101 are not yet fully formed), and the peripheral circuit region 192. In FIG. 30, poly layers 206 and 2502 are disposed in both the memory cell region 191 and the peripheral circuit region 192. In FIG. 31, poly 206 has been etched to concurrently form control gate 120 of memory cell 101' and gate 121 of peripheral transistor 105' (designated as such because the transistor 105 is not yet fully formed). Stated another way, a single etch concurrently forms gates 120 and 121 of the memory cell and the peripheral transistor, respectively.

Figure 27:
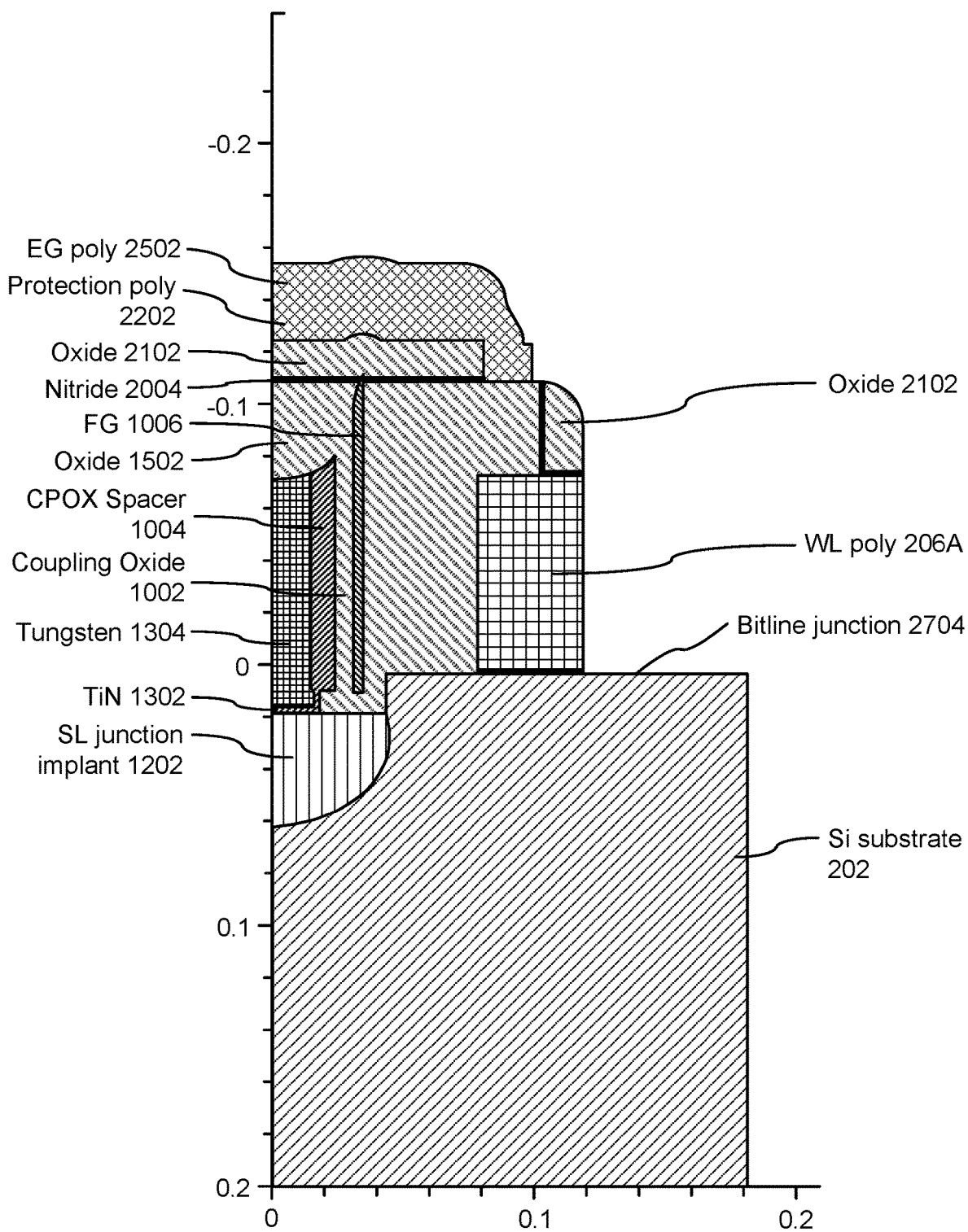
Figure 28:
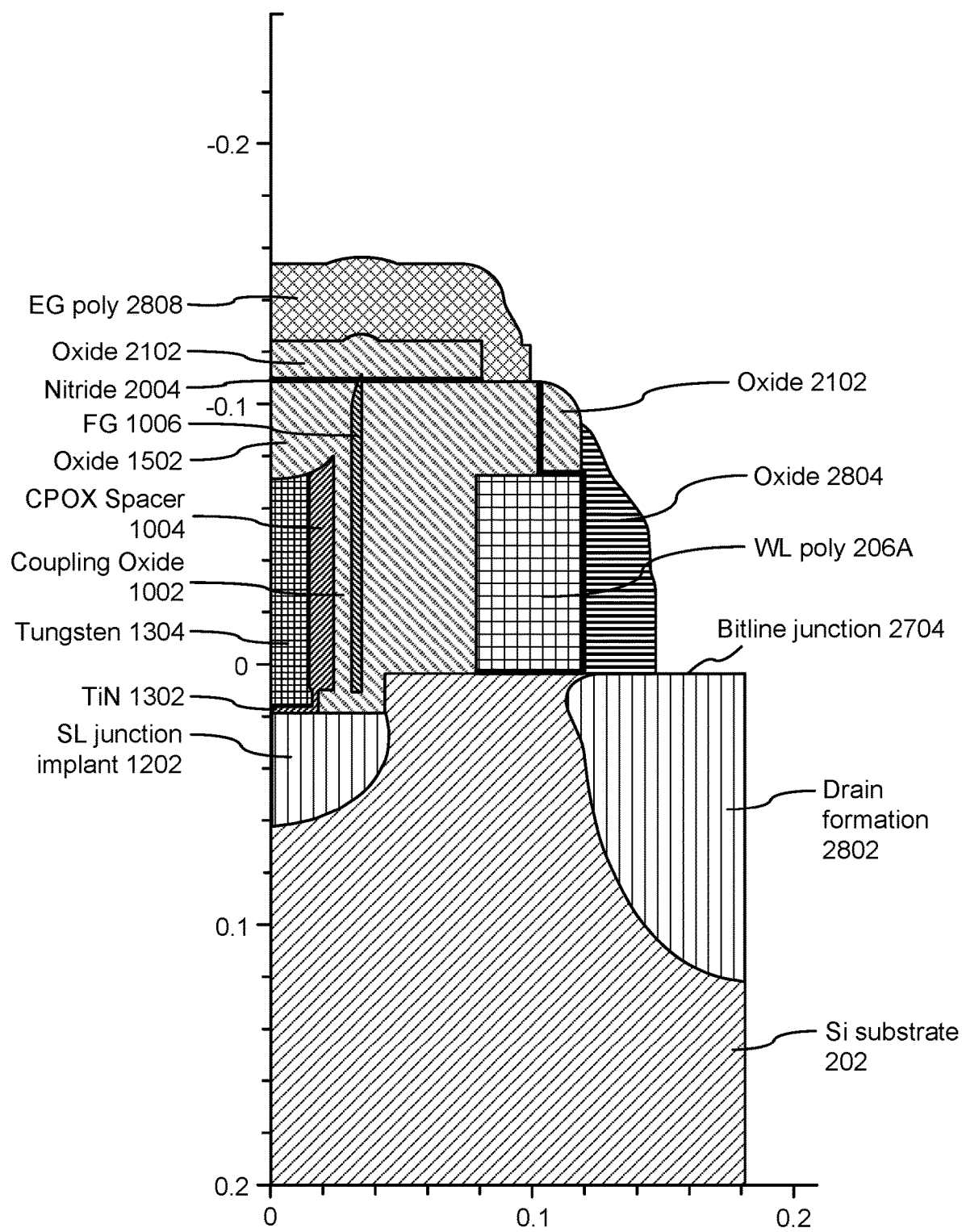
Figure 29:
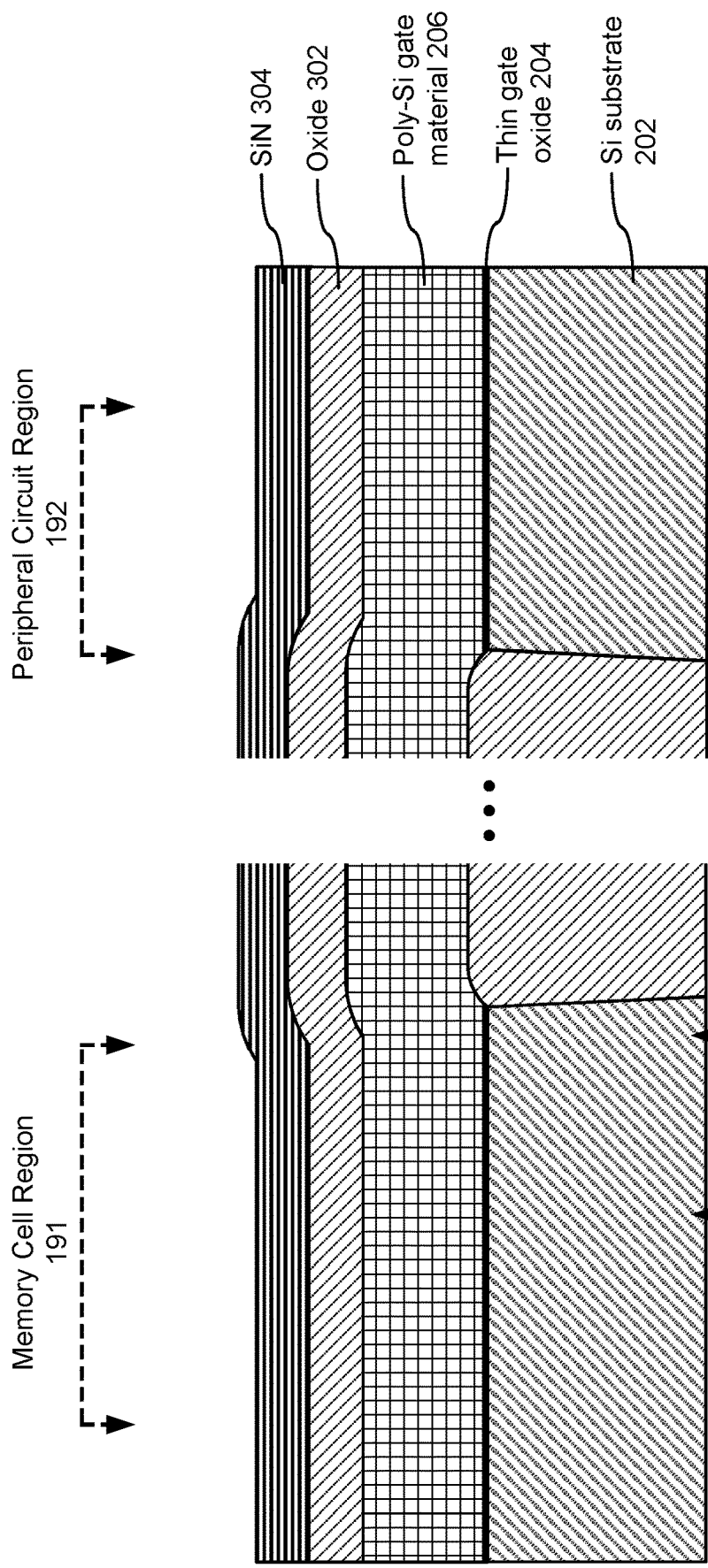
FIGS. 29-33 illustrate expanded views of the process as described in FIGS. 3 and 25-28 in accordance with some embodiments.

Referring to FIG. 27, a bit line junction halo implant (not shown) is performed. In some embodiments, the halo implant is a boron implant. This increases the concentration of boron underneath the word line, and that high concentration region can block punch-through between the bit line junction 2704 and the source line junction 1202/1304. Punch-through issues may arise during programming due to the high voltage being applied to the source line junction (e.g., 4-6V). As such, a region with high doping (e.g., boron) is placed between the bit line and source line junctions to prevent punch-through. In some embodiments, this step (the bit line junction halo implant) is concurrently performed in the peripheral circuit region 192 (see FIG. 32).

Referring to FIG. 28, the drain 2802 is formed. In some embodiments, the source and/or the drain of peripheral transistors 105 in the peripheral circuit region 192 are concurrently formed with drain 2802 (see FIG. 33). In some embodiments, the halo implant is performed in conjunction with an LDD (lightly doped drain) implant. For LDD implantation, a lightly doped region is implanted and spaced out with an LDD spacer (e.g., oxide 2804). In some embodiments, the lightly doped drain region is formed using processing steps well known in the semiconductor industry to form drain regions that include lightly doped drain (LDD) sub-regions adjacent neighboring transistor gates and more heavily doped drain sub-regions not adjacent the neighboring transistor gates, one example of which is described in U.S. Pat. No. 4,994,404, followed by contact formation and the subsequent metallization and other steps to complete the device manufacturing.

The embodiments described herein describe a process in which the memory cell formation steps have been moved to the middle of the overall integrated circuit manufacturing process flow. Stated another way, the steps shown in FIGS. 2-25 are inserted between the forming of peripheral logic and the steps shown in FIGS. 26-28. By doing this, the manufacturing process is simplified and several steps are easier to control. More specifically, referring back to FIG. 2, the thin gate oxide 204 is used for formation of the memory cell 100 as well as for the transistors in the peripheral logic. Before performing steps subsequent to that shown in FIG. 2, the gate oxide regions and poly gate material for transistors in the peripheral logic region are already formed. After the logic transistor areas are defined and gate oxide material is formed, the polysilicon gate material 206 is deposited (FIG. 2). In previous processes (e.g., as described in U.S. patent application Ser. No. 16/122,800) the process would instead jump to FIG. 26, where the erase gate is defined. However, in the currently described embodiments, a resist mask 402 (FIG. 4) defines the memory cell source line region openings, which in turn are used in later steps to define the poly regions for word line 206. Thus, the word line is self-aligned to an edge of the source line region opening. The etching of poly to form the control gate in the memory cell and the gate in the peripheral logic region is accomplished by the same etching step.

Notes Regarding the Disclosure

The terminology used in the description of various materials is for the purpose of describing particular embodiments only and is not intended to be limiting. For example, "oxide" is one example of a dielectric material and can be substituted with other dielectrics; "polysilicon" and "tungsten" are examples of gate conductor materials and can be substituted with other conducting materials, and so forth.

Further, the numbers in the axes of the figures have been added for relative reference. Some embodiments of the present disclosure are targeted for 40 nm technology. For such a fabrication process, the specified Angstrom numbers are optimized for 40 nm. However, other process sizes are contemplated and neither "40 nm" nor the numbers in the axes of the figures are intended to be limiting.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof As used herein, the term "if" is, optionally, construed to mean "when," or "upon," or "in response to determining," or "in response to detecting," depending on the context. Similarly, the phrase "if it is determined" or "if [a stated condition or event] is detected" is, optionally, construed to mean "upon determining," or "in accordance with a determination that," or "in response to determining" or "upon detecting [the stated condition or event]" or "in response to detecting [the stated condition or event]," depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of fabricating an electrically erasable programmable nonvolatile memory cell in a memory cell region of an integrated circuit, and a logic transistor in a peripheral region of the integrated circuit outside the memory cell region, the method comprising:

concurrently, in both the memory cell region and the peripheral region:
forming a gate dielectric layer on a top surface of a substrate of the integrated circuit; and
after forming the gate dielectric layer, depositing a gate conductor material over the gate dielectric layer;
in the memory cell region, after forming the gate conductor material:
forming a trench in the substrate;
forming a vertical floating gate having a portion disposed inside the trench;
forming a source region underneath the trench in the substrate;
forming a source line adjacent to the vertical floating gate, the source line having a portion disposed inside the trench;

forming an erase gate over a portion of a tunneling dielectric layer extending over the vertical floating gate; and concurrently:
in the memory cell region, forming a word line using a portion of the gate conductor material, the word line including a control gate of the electrically erasable programmable nonvolatile memory cell, and
in the peripheral region, forming a transistor gate of the logic transistor.

2. The method of claim 1, further comprising:
implanting, in a region of the substrate adjacent to the word line, drain material having a doping concentration different from that of the substrate; and
implanting the drain material in drain and source regions of the logic transistor.

3. The method of claim 1, wherein forming the source region comprises:
implanting, in a region underneath the trench, source material having a doping concentration different from that of the substrate.

4. The method of claim 3, wherein forming the source line comprises:
forming the source line in an exposed region of the substrate adjacent to the floating gate and above the source material.

5. The method of claim 1, wherein the gate dielectric layer is a thin gate oxide, and the gate conductor material is polysilicon.

6. The method of claim 1, wherein forming the erase gate comprises:
forming a first word line spacer above a portion of the gate conductor material;
depositing the tunneling dielectric layer, extending over the floating gate and the portion of the gate conductor material; and
forming the erase gate over a portion of the tunneling dielectric layer that is disposed above the floating gate.

7. The method of claim 6, wherein forming the word line comprises:
forming a second word line spacer adjacent to the first word line spacer using the tunneling dielectric layer; and
defining the word line using a portion of the gate conductor material disposed underneath the first and second word line spacers.

8. The method of claim 6, wherein forming the trench in the substrate comprises:
removing a portion of the gate dielectric layer and the gate conductor material to create an exposed region of the substrate; and
forming the trench in the exposed region of the substrate.

9. The method of claim 8, wherein removing the portion of the gate dielectric layer and the gate conductor material comprises:
depositing a first stacking oxide layer over the gate conductor;
depositing a nitride layer over the first stacking oxide layer; and
using a mask to anisotropically etch through the nitride layer, the first stacking oxide layer, the gate conductor material, and the gate dielectric layer.

10. The method of claim 9, wherein forming the trench in the exposed region of the substrate comprises:
depositing a decoupling oxide over a first portion of the exposed region of the substrate adjacent to the nitride layer, the first stacking oxide layer, the gate conductor material, and the gate dielectric layer; and
etching a second portion of the exposed region of the substrate adjacent to the first portion of the exposed region of the substrate.

11. The method of claim 10, wherein forming the vertical floating gate comprises:
depositing a floating gate oxide layer over the trench and the decoupling oxide;
depositing a floating gate metal layer over the floating gate oxide layer;
depositing a floating gate protection layer over the metal layer; and
etching the floating gate protection layer, the floating gate metal layer, and the floating gate oxide layer, leaving the vertical floating gate and leaving a region of the floating gate oxide layer disposed (i) underneath the floating gate metal layer and above the trench, and (ii) between the floating gate metal layer and a sidewall of the trench.

12. The method of claim 11, wherein the floating gate oxide layer has a thickness equal to or less than 80 Angstroms, the floating gate metal layer has a thickness equal to or less than 30 Angstroms, and wherein the floating gate protection layer has a thickness equal to or less than 10 Angstroms.

13. The method of claim 11, wherein the floating gate metal layer is titanium nitride.

14. The method of claim 11, wherein forming the vertical floating gate further comprises: depositing a coupling oxide adjacent to and over the floating gate protection and metal layers;
depositing a coupling oxide protection spacer over the coupling oxide; and
etching the coupling oxide protection spacer and the coupling oxide such that (i) a portion of the trench adjacent to the coupling oxide and the coupling oxide protection spacer is exposed, and (ii) the nitride layer over the first stacking oxide layer is exposed.

15. The method of claim 14, wherein forming the source line comprises:
depositing a barrier layer over the exposed portion of the trench adjacent to the coupling oxide protection spacer;
depositing source line conductive material over the barrier layer; and
etching the source line conductive material and the barrier layer, leaving source line conductive material disposed in the trench and extending vertically above the trench adjacent to the coupling oxide protection spacer.

16. The method of claim 15, wherein the barrier layer is titanium nitride, and the source line conductive material is tungsten.

17. The method of claim 11, wherein forming the first word line spacer comprises:
depositing a second stacking oxide layer over the source line, the floating gate, the decoupling oxide, and the nitride layer;
planarizing the second stacking oxide layer to expose the nitride layer;
stripping the nitride layer to expose the first stacking oxide layer; and
forming a nitride spacer over a portion of the first stacking oxide layer;
etching portions of the first stacking oxide layer that are not masked by the nitride spacer, revealing an exposed portion of the gate conducting material; and etching the nitride spacer to expose a word line spacer portion of the first stacking oxide layer disposed over a portion of the gate conductor material.

18. The method of claim 17, wherein the word line spacer portion of the first stacking oxide layer has a thickness equal to or less than 250 Angstroms.

19. The method of claim 17, wherein forming the erase gate comprises:
depositing a layer of protection polysilicon over the tunneling dielectric layer;
etching the layer of protection polysilicon to reveal an exposed portion of the tunneling dielectric layer disposed over the word line spacer portion of the first stacking oxide layer and the gate conductor material;
etching (i) a first portion of the exposed tunneling dielectric layer disposed over the word line spacer portion of the first stacking oxide layer, and (ii) a second portion of the exposed tunneling dielectric layer disposed over a portion of the gate conductor material, leaving a combined word line spacer comprising a word line spacer portion of the tunneling dielectric layer disposed over the gate conductive material and adjacent to the word line spacer portion of the first stacking oxide layer; and
depositing erase gate polysilicon over the protection polysilicon.

20. The method of claim 19, wherein defining the word line comprises:
etching portions of the gate conductor material that are not disposed underneath the combined word line spacer.

21. The method of claim 1, wherein the tunneling dielectric layer is an oxide layer having a thickness equal to or less than 300 Angstroms.

22. A method of fabricating an electrically erasable programmable nonvolatile memory cell, the method comprising:
fabricating a logic transistor peripheral to the memory cell, wherein fabricating the logic transistor includes (i) forming a gate dielectric layer on a top surface of a substrate; and (ii) depositing a gate conductor material over the gate dielectric layer;
removing a portion of the gate dielectric layer and the gate conductor material to create an exposed region of the substrate;
forming a trench in the exposed region of the substrate;
forming a vertical floating gate having a portion disposed inside the trench;
implanting, in a region underneath the trench, source material having a doping concentration different from that of the substrate;
forming, in the exposed region of the substrate adjacent to the vertical floating gate and above the source material, a source line having a portion disposed inside the trench;
forming a word line spacer above a portion of the gate conductor material;
depositing a tunneling dielectric layer extending over the vertical floating gate and the portion of the gate conductor material;
forming an erase gate over a portion of the dielectric layer that is disposed above the vertical floating gate;
defining a word line using a portion of the gate conductor material disposed underneath the word line spacer; and
implanting, in a region of the substrate adjacent to the word line, drain material having a doping concentration different from that of the substrate.

23. The method of claim 11, wherein the floating gate protection layer is silicon nitride.

* * * * *